(12) United States Patent
Tao et al.

(10) Patent No.: US 8,270,056 B2
(45) Date of Patent: Sep. 18, 2012

(54) DISPLAY DEVICE WITH OPENINGS BETWEEN SUB-PIXELS AND METHOD OF MAKING SAME

(75) Inventors: Yi Tao, San Jose, CA (US); Fan Zhong, Fremont, CA (US); Marc Mignard, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 618 days.

(21) Appl. No.: 12/409,425

(22) Filed: Mar. 23, 2009

(65) Prior Publication Data
US 2010/0238572 A1    Sep. 23, 2010

(51) Int. Cl.
G02B 26/08    (2006.01)
G02B 7/188    (2006.01)

(52) U.S. Cl. .............. 359/224.1; 359/290; 359/295; 359/847; 359/849

(58) Field of Classification Search .......... 359/290, 359/291, 223, 224, 295, 578, 579, 846–850
See application file for complete search history.

(56) References Cited

U.S. PATENT DOCUMENTS

| | | |
|---|---|---|
| 2,590,906 A | 1/1952 | Tripp |
| 2,677,714 A | 5/1954 | Auwarter |
| 3,037,189 A | 5/1962 | Barrett et al. |
| 3,210,757 A | 10/1965 | Jacob |
| 3,247,392 A | 4/1966 | Thelen |
| 3,679,313 A | 7/1972 | Rosenberg |
| 3,728,030 A | 4/1973 | Hawes |
| 3,886,310 A | 5/1975 | Guldberg |
| 3,955,190 A | 5/1976 | Teraishi |
| 4,403,248 A | 9/1983 | te Velde |
| 4,421,381 A | 12/1983 | Ueda et al. |
| 4,441,789 A | 4/1984 | Pohlack |
| 4,441,791 A | 4/1984 | Hornbeck |

(Continued)

FOREIGN PATENT DOCUMENTS

DE    10 2006 039 071    2/2008

(Continued)

OTHER PUBLICATIONS

Brosnihan et al., Jun. 2003, Optical IMEMS—a fabrication process for MEMS optical switches with integrated on-chip electronic, Transducers, Solid-State Sensors, Actuators and Microsystems, 12th International Conference 2003, 2(8-12):1638-1642.

(Continued)

*Primary Examiner* — Frank Font
(74) *Attorney, Agent, or Firm* — Knobbe, Martens, Olson & Bear LLP

(57) ABSTRACT

An electromechanical systems device includes a plurality of supports disposed over a substrate and a deformable reflective layer disposed over the plurality of supports. The deformable reflective layer includes a plurality of substantially parallel columns extending in a first direction. Each column has one or more slots extending in a second direction generally perpendicular to the first direction. The slots can be created at boundary edges of sub-portions of the columns so as to partially mechanically separate the sub-portions without electrically disconnecting them. A method of fabricating an electromechanical device includes depositing an electrically conductive deformable reflective layer over a substrate, removing one or more portions of the deformable layer to form a plurality of electrically isolated columns, and forming at least one crosswise slot in at least one of the columns.

23 Claims, 20 Drawing Sheets

U.S. PATENT DOCUMENTS

| | | | |
|---|---|---|---|
| 4,497,974 A | 2/1985 | Deckman et al. | |
| 4,498,953 A | 2/1985 | Cook et al. | |
| 4,560,435 A | 12/1985 | Brown et al. | |
| 4,655,554 A | 4/1987 | Armitage | |
| 4,705,361 A | 11/1987 | Frazier et al. | |
| 4,779,959 A | 10/1988 | Saunders | |
| 4,786,128 A | 11/1988 | Birnbach | |
| 4,822,993 A | 4/1989 | Dillon et al. | |
| 4,859,060 A | 8/1989 | Katagiri et al. | |
| 4,925,259 A | 5/1990 | Emmett | |
| 4,954,789 A | 9/1990 | Sampsell | |
| 4,956,619 A | 9/1990 | Hornbeck | |
| 4,973,131 A | 11/1990 | Carnes | |
| 4,982,184 A | 1/1991 | Kirkwood | |
| 5,022,745 A | 6/1991 | Zahowski et al. | |
| 5,028,939 A | 7/1991 | Hornbeck et al. | |
| 5,062,689 A | 11/1991 | Koehler | |
| 5,091,983 A | 2/1992 | Lukosz | |
| 5,096,279 A | 3/1992 | Hornbeck et al. | |
| 5,170,283 A | 12/1992 | O'Brien et al. | |
| 5,315,370 A | 5/1994 | Bulow | |
| 5,381,232 A | 1/1995 | Van Wijk | |
| 5,452,138 A | 9/1995 | Mignardi et al. | |
| 5,471,341 A | 11/1995 | Warde et al. | |
| 5,499,037 A | 3/1996 | Nakagawa et al. | |
| 5,526,172 A | 6/1996 | Kanack | |
| 5,550,373 A | 8/1996 | Cole et al. | |
| 5,559,358 A | 9/1996 | Burns et al. | |
| 5,561,523 A | 10/1996 | Blomberg et al. | |
| 5,597,736 A | 1/1997 | Sampsell | |
| 5,600,383 A | 2/1997 | Hornbeck | |
| 5,636,052 A | 6/1997 | Arney et al. | |
| 5,646,729 A | 7/1997 | Koskinen et al. | |
| 5,646,768 A | 7/1997 | Kaeiyama | |
| 5,661,592 A | 8/1997 | Bornstein et al. | |
| 5,665,997 A | 9/1997 | Weaver et al. | |
| 5,686,979 A | 11/1997 | Weber et al. | |
| 5,699,181 A | 12/1997 | Choi | |
| 5,710,656 A | 1/1998 | Goosen | |
| 5,719,068 A | 2/1998 | Suzawa et al. | |
| 5,734,177 A | 3/1998 | Sakamoto | |
| 5,771,116 A | 6/1998 | Miller et al. | |
| 5,786,927 A | 7/1998 | Greywall et al. | |
| 5,808,781 A | 9/1998 | Arney et al. | |
| 5,815,141 A | 9/1998 | Phares | |
| 5,818,095 A | 10/1998 | Sampsell | |
| 5,825,528 A | 10/1998 | Goosen | |
| 5,838,484 A | 11/1998 | Goossen et al. | |
| 5,867,302 A | 2/1999 | Fleming | |
| 5,870,221 A | 2/1999 | Goossen | |
| 5,905,482 A | 5/1999 | Hughes et al. | |
| 5,914,804 A | 6/1999 | Goossen | |
| 5,920,418 A | 7/1999 | Shiono et al. | |
| 5,933,183 A | 8/1999 | Enomoto et al. | |
| 5,961,848 A | 10/1999 | Jacquet et al. | |
| 6,028,689 A | 2/2000 | Michalicek et al. | |
| 6,028,690 A | 2/2000 | Carter et al. | |
| 6,031,653 A | 2/2000 | Wang | |
| 6,040,937 A | 3/2000 | Miles | |
| 6,046,659 A | 4/2000 | Loo et al. | |
| 6,055,090 A | 4/2000 | Miles | |
| 6,100,861 A | 8/2000 | Cohen et al. | |
| 6,124,851 A | 9/2000 | Jacobson | |
| 6,242,932 B1 | 6/2001 | Hembree | |
| 6,262,697 B1 | 7/2001 | Stephenson | |
| 6,285,424 B1 | 9/2001 | Yoshida | |
| 6,301,000 B1 | 10/2001 | Johnson | |
| 6,323,987 B1 | 11/2001 | Rinaudo et al. | |
| 6,327,071 B1 | 12/2001 | Kimura | |
| 6,335,235 B1 | 1/2002 | Bhekta et al. | |
| 6,339,417 B1 | 1/2002 | Quanrud | |
| 6,351,329 B1 | 2/2002 | Greywall | |
| 6,356,378 B1 | 3/2002 | Huibers | |
| 6,377,233 B2 | 4/2002 | Colgan et al. | |
| 6,381,022 B1 | 4/2002 | Zavracky | |
| 6,384,952 B1 | 5/2002 | Clark et al. | |
| 6,400,738 B1 | 6/2002 | Tucker et al. | |
| 6,417,868 B1 | 7/2002 | Bock | |
| 6,433,917 B1 | 8/2002 | Mei et al. | |
| 6,437,583 B1 | 8/2002 | Tartagni et al. | |
| 6,438,282 B1 | 8/2002 | Takeda et al. | |
| 6,452,712 B2 | 9/2002 | Atobe et al. | |
| 6,466,354 B1 | 10/2002 | Gudeman | |
| 6,519,073 B1 | 2/2003 | Goossen | |
| 6,556,338 B2 | 4/2003 | Han et al. | |
| 6,574,033 B1 | 6/2003 | Chui et al. | |
| 6,597,490 B2 | 7/2003 | Tayebati | |
| 6,608,268 B1 | 8/2003 | Goldsmith | |
| 6,632,698 B2 | 10/2003 | Ives | |
| 6,650,455 B2 | 11/2003 | Miles | |
| 6,657,832 B2 | 12/2003 | Williams et al. | |
| 6,661,561 B2 | 12/2003 | Fitzpatrick et al. | |
| 6,674,562 B1 | 1/2004 | Miles et al. | |
| 6,680,792 B2 | 1/2004 | Miles | |
| 6,698,295 B1 | 3/2004 | Sherrer | |
| 6,710,908 B2 | 3/2004 | Miles et al. | |
| 6,738,194 B1 | 5/2004 | Ramirez et al. | |
| 6,768,555 B2 | 7/2004 | Chen | |
| 6,794,119 B2 | 9/2004 | Miles | |
| 6,813,059 B2 | 11/2004 | Hunter et al. | |
| 6,822,780 B1 | 11/2004 | Long | |
| 6,836,366 B1 | 12/2004 | Flanders et al. | |
| 6,841,081 B2 | 1/2005 | Chang et al. | |
| 6,844,959 B2 | 1/2005 | Huibers et al. | |
| 6,849,471 B2 | 2/2005 | Patel et al. | |
| 6,862,127 B1 | 3/2005 | Ishii | |
| 6,867,896 B2 | 3/2005 | Miles | |
| 6,870,654 B2 | 3/2005 | Lin et al. | |
| 6,882,458 B2 | 4/2005 | Lin et al. | |
| 6,882,461 B1 | 4/2005 | Tsai et al. | |
| 6,912,022 B2 | 6/2005 | Lin et al. | |
| 6,913,942 B2 | 7/2005 | Patel et al. | |
| 6,940,630 B2 | 9/2005 | Xie | |
| 6,947,200 B2 | 9/2005 | Huibers | |
| 6,952,303 B2 | 10/2005 | Lin et al. | |
| 6,958,847 B2 | 10/2005 | Lin | |
| 6,960,305 B2 | 11/2005 | Doan et al. | |
| 6,980,350 B2 | 12/2005 | Hung et al. | |
| 6,982,820 B2 | 1/2006 | Tsai | |
| 7,002,726 B2 | 2/2006 | Patel et al. | |
| 7,006,272 B2 | 2/2006 | Tsai | |
| 7,009,754 B2 | 3/2006 | Huibers | |
| 7,027,204 B2 | 4/2006 | Trisnadi et al. | |
| 7,034,981 B2 | 4/2006 | Makigaki | |
| 7,046,422 B2 | 5/2006 | Kimura et al. | |
| 7,072,093 B2 | 7/2006 | Piehl et al. | |
| 7,113,339 B2 | 9/2006 | Taguchi et al. | |
| 7,119,945 B2 | 10/2006 | Kothari et al. | |
| 7,123,216 B1 | 10/2006 | Miles | |
| 7,126,738 B2 | 10/2006 | Miles | |
| 7,130,104 B2 | 10/2006 | Cummings | |
| 7,161,728 B2 | 1/2007 | Sampsell et al. | |
| 7,184,195 B2 | 2/2007 | Yang | |
| 7,184,202 B2 | 2/2007 | Miles et al. | |
| 7,198,973 B2 | 4/2007 | Lin et al. | |
| 7,205,722 B2 | 4/2007 | Koshio et al. | |
| 7,221,495 B2 | 5/2007 | Miles et al. | |
| 7,236,284 B2 | 6/2007 | Miles | |
| 7,245,285 B2 | 7/2007 | Yeh et al. | |
| 7,250,930 B2 | 7/2007 | Hoffman et al. | |
| 7,289,259 B2 * | 10/2007 | Chui et al. | 359/291 |
| 7,302,157 B2 | 11/2007 | Chui | |
| 7,321,456 B2 | 1/2008 | Cummings | |
| 7,321,457 B2 | 1/2008 | Heald | |
| 7,327,510 B2 | 2/2008 | Cummings et al. | |
| 7,339,170 B2 * | 3/2008 | Deliwala | 250/351 |
| 7,358,103 B2 * | 4/2008 | Li et al. | 438/29 |
| 7,372,613 B2 | 5/2008 | Chui et al. | |
| 7,372,619 B2 | 5/2008 | Miles | |
| 7,385,744 B2 | 6/2008 | Kogut et al. | |
| 7,385,762 B2 | 6/2008 | Cummings | |
| 7,400,488 B2 | 7/2008 | Lynch et al. | |
| 7,405,852 B2 | 7/2008 | Brosnihan et al. | |
| 7,417,746 B2 | 8/2008 | Lin et al. | |
| 7,420,725 B2 | 9/2008 | Kothari | |
| 7,436,573 B2 | 10/2008 | Doan et al. | |
| 7,459,402 B2 | 12/2008 | Doan et al. | |

| | | |
|---|---|---|
| 7,460,291 B2 | 12/2008 | Sampsell et al. |
| 7,460,292 B2 | 12/2008 | Chou |
| 7,471,442 B2 | 12/2008 | Sampsell |
| 7,476,327 B2 | 1/2009 | Tung et al. |
| 7,477,440 B1 | 1/2009 | Huang et al. |
| 7,492,503 B2 | 2/2009 | Chui |
| 7,508,566 B2 | 3/2009 | Feenstra et al. |
| 7,515,327 B2 | 4/2009 | Cummings |
| 7,527,995 B2 | 5/2009 | Sampsell |
| 7,527,998 B2 | 5/2009 | Tung et al. |
| 7,532,377 B2 | 5/2009 | Miles |
| 7,532,381 B2 | 5/2009 | Miles |
| 7,535,621 B2 | 5/2009 | Chiang |
| 7,542,198 B2 | 6/2009 | Kothari |
| 7,550,810 B2 | 6/2009 | Mignard et al. |
| 7,554,711 B2 | 6/2009 | Miles |
| 7,554,714 B2 | 6/2009 | Chui et al. |
| 7,561,321 B2 | 7/2009 | Heald |
| 7,564,612 B2 | 7/2009 | Chui |
| 7,566,664 B2 | 7/2009 | Yan et al. |
| 7,567,373 B2 | 7/2009 | Chui et al. |
| 7,569,488 B2 | 8/2009 | Rafanan |
| 7,612,932 B2 * | 11/2009 | Chui et al. ............ 359/290 |
| 7,612,933 B2 | 11/2009 | Djordjev |
| 7,629,197 B2 | 12/2009 | Luo et al. |
| 7,782,523 B2 | 8/2010 | Ishii |
| 7,813,029 B2 | 10/2010 | Kothari et al. |
| 7,848,003 B2 | 12/2010 | Kothari et al. |
| 7,852,544 B2 | 12/2010 | Sampsell |
| 7,855,826 B2 | 12/2010 | de Groot |
| RE42,119 E | 2/2011 | Chui et al. |
| 7,898,722 B2 | 3/2011 | Miles |
| 7,898,725 B2 | 3/2011 | Sampsell |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2001/0055208 A1 | 12/2001 | Kimura |
| 2002/0051281 A1 | 5/2002 | Ueda et al. |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2002/0149834 A1 | 10/2002 | Mei et al. |
| 2002/0154422 A1 | 10/2002 | Sniegowski et al. |
| 2002/0186209 A1 | 12/2002 | Cok |
| 2002/0197761 A1 | 12/2002 | Patel et al. |
| 2003/0011864 A1 | 1/2003 | Flanders |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0123125 A1 | 7/2003 | Little |
| 2003/0138669 A1 | 7/2003 | Kojima et al. |
| 2003/0173504 A1 | 9/2003 | Cole et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0058532 A1 | 3/2004 | Miles et al. |
| 2004/0066477 A1 | 4/2004 | Morimoto et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0184766 A1 | 9/2004 | Kim et al. |
| 2004/0188599 A1 | 9/2004 | Viktorovitch et al. |
| 2004/0207897 A1 | 10/2004 | Lin |
| 2004/0209195 A1 | 10/2004 | Lin |
| 2004/0217264 A1 | 11/2004 | Wood et al. |
| 2004/0217919 A1 | 11/2004 | Piehl et al. |
| 2004/0218251 A1 | 11/2004 | Piehl et al. |
| 2004/0240032 A1 | 12/2004 | Miles |
| 2004/0259010 A1 | 12/2004 | Kanbe |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0069209 A1 | 3/2005 | Damera-Venkata et al. |
| 2005/0078348 A1 | 4/2005 | Lin |
| 2005/0117190 A1 | 6/2005 | Iwauchi et al. |
| 2005/0117623 A1 | 6/2005 | Shchukin et al. |
| 2005/0122294 A1 | 6/2005 | Ben-David et al. |
| 2005/0128543 A1 | 6/2005 | Phillips et al. |
| 2005/0133761 A1 | 6/2005 | Thielemans |
| 2005/0168849 A1 | 8/2005 | Lin |
| 2005/0179378 A1 | 8/2005 | Oooka et al. |
| 2005/0195462 A1 | 9/2005 | Lin |
| 2005/0275930 A1 | 12/2005 | Patel et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0038643 A1 | 2/2006 | Xu et al. |
| 2006/0065940 A1 | 3/2006 | Kothari |
| 2006/0066559 A1 | 3/2006 | Chui |
| 2006/0066640 A1 | 3/2006 | Kothari et al. |
| 2006/0066641 A1 | 3/2006 | Gally et al. |
| 2006/0066936 A1 | 3/2006 | Chui et al. |
| 2006/0067649 A1 | 3/2006 | Tung et al. |
| 2006/0077155 A1 | 4/2006 | Chui et al. |
| 2006/0077156 A1 | 4/2006 | Chui et al. |
| 2006/0082588 A1 | 4/2006 | Mizuno et al. |
| 2006/0082863 A1 | 4/2006 | Piehl et al. |
| 2006/0132927 A1 | 6/2006 | Yoon |
| 2006/0180886 A1 | 8/2006 | Tsang |
| 2006/0220160 A1 | 10/2006 | Miles |
| 2006/0262126 A1 | 11/2006 | Miles |
| 2007/0020948 A1 | 1/2007 | Piehl et al. |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0121118 A1 | 5/2007 | Gally et al. |
| 2007/0138608 A1 | 6/2007 | Ikehashi |
| 2007/0153860 A1 | 7/2007 | Chang-Hasnain et al. |
| 2007/0177247 A1 | 8/2007 | Miles |
| 2007/0205969 A1 | 9/2007 | Hagood et al. |
| 2007/0216987 A1 | 9/2007 | Hagood et al. |
| 2007/0253054 A1 | 11/2007 | Miles |
| 2007/0268211 A1 | 11/2007 | Whitehead et al. |
| 2007/0279729 A1 | 12/2007 | Kothari et al. |
| 2007/0279730 A1 | 12/2007 | Heald |
| 2007/0285761 A1 | 12/2007 | Zhong et al. |
| 2008/0002299 A1 | 1/2008 | Thurn |
| 2008/0013144 A1 * | 1/2008 | Chui et al. ............ 359/224 |
| 2008/0013145 A1 | 1/2008 | Chui et al. |
| 2008/0030657 A1 | 2/2008 | Wu et al. |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0068697 A1 | 3/2008 | Haluzak et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |

| | | | |
|---|---|---|---|
| 2008/0151353 A1 | 6/2008 | Haskett | |
| 2008/0158645 A1 | 7/2008 | Chiang | |
| 2008/0186581 A1 | 8/2008 | Bita et al. | |
| 2008/0239455 A1 | 10/2008 | Kogut et al. | |
| 2008/0247028 A1 | 10/2008 | Chui et al. | |
| 2008/0278787 A1 | 11/2008 | Sasagawa | |
| 2008/0278788 A1 | 11/2008 | Sasagawa | |
| 2008/0288225 A1 | 11/2008 | Djordjev et al. | |
| 2008/0297880 A1 | 12/2008 | Steckl et al. | |
| 2008/0316566 A1 | 12/2008 | Lan | |
| 2008/0316568 A1 | 12/2008 | Griffiths et al. | |
| 2009/0009444 A1 | 1/2009 | Heald et al. | |
| 2009/0009845 A1 | 1/2009 | Endisch et al. | |
| 2009/0021884 A1 | 1/2009 | Nakamura | |
| 2009/0068781 A1 | 3/2009 | Tung et al. | |
| 2009/0073534 A1 | 3/2009 | Lee et al. | |
| 2009/0073539 A1 | 3/2009 | Mignard | |
| 2009/0078316 A1 | 3/2009 | Khazeni | |
| 2009/0080060 A1 | 3/2009 | Sampsell et al. | |
| 2009/0101192 A1 | 4/2009 | Kothari et al. | |
| 2009/0103166 A1 | 4/2009 | Khazeni et al. | |
| 2009/0103168 A1 | 4/2009 | Sampsell | |
| 2009/0122384 A1 | 5/2009 | Felnhofer et al. | |
| 2009/0126777 A1 | 5/2009 | Khazeni et al. | |
| 2009/0135465 A1 | 5/2009 | Chui | |
| 2009/0147343 A1 | 6/2009 | Kogut et al. | |
| 2009/0159123 A1 | 6/2009 | Kothari | |
| 2009/0201566 A1 | 8/2009 | Kothari | |
| 2009/0211885 A1 | 8/2009 | Steeneken et al. | |
| 2009/0213450 A1 | 8/2009 | Sampsell | |
| 2009/0213451 A1 | 8/2009 | Tung et al. | |
| 2009/0225395 A1 | 9/2009 | Ganti et al. | |
| 2009/0231496 A1 | 9/2009 | Nishino et al. | |
| 2009/0231666 A1 | 9/2009 | Gudlavalleti et al. | |
| 2009/0251761 A1 | 10/2009 | Khazeni et al. | |
| 2009/0256218 A1 | 10/2009 | Mignard et al. | |
| 2009/0257105 A1 | 10/2009 | Xu et al. | |
| 2009/0273823 A1 | 11/2009 | Tung et al. | |
| 2009/0273824 A1 | 11/2009 | Sasagawa | |
| 2009/0279162 A1 | 11/2009 | Chui | |
| 2009/0293955 A1 | 12/2009 | Kothari et al. | |
| 2009/0323153 A1 | 12/2009 | Sampsell | |
| 2009/0323165 A1 | 12/2009 | Sampsell | |
| 2009/0323166 A1 | 12/2009 | Sampsell | |
| 2010/0014148 A1 | 1/2010 | Djordjev | |
| 2010/0039370 A1 | 2/2010 | Miles | |
| 2010/0051089 A1 | 3/2010 | Khazeni et al. | |
| 2010/0053148 A1 | 3/2010 | Khazeni et al. | |
| 2010/0080890 A1 | 4/2010 | Tung et al. | |
| 2010/0085626 A1 | 4/2010 | Tung et al. | |
| 2010/0096006 A1 | 4/2010 | Griffiths | |
| 2010/0096011 A1 | 4/2010 | Griffiths | |
| 2010/0118382 A1 | 5/2010 | Kothari et al. | |
| 2010/0128337 A1 | 5/2010 | Tung | |
| 2010/0182675 A1 | 7/2010 | Sampsell et al. | |
| 2010/0236624 A1 | 9/2010 | Khazeni et al. | |
| 2010/0309572 A1 | 12/2010 | Mignard | |
| 2011/0019380 A1 | 1/2011 | Miles | |
| 2011/0026095 A1 | 2/2011 | Kothari et al. | |
| 2011/0026096 A1 | 2/2011 | Miles | |
| 2011/0038027 A1 | 2/2011 | Miles | |
| 2011/0044496 A1 | 2/2011 | Chui et al. | |
| 2011/0069371 A1 | 3/2011 | Kothari et al. | |
| 2011/0080632 A1 | 4/2011 | Miles | |
| 2011/0090554 A1 | 4/2011 | Tung | |
| 2011/0116156 A1 | 5/2011 | Kothari | |
| 2011/0134505 A1 | 6/2011 | Sasagawa | |
| 2011/0170166 A1 | 7/2011 | Miles | |
| 2011/0170167 A1 | 7/2011 | Miles | |
| 2011/0170168 A1 | 7/2011 | Endisch et al. | |
| 2011/0188109 A1 | 8/2011 | Chui et al. | |
| 2011/0188110 A1 | 8/2011 | Miles | |
| 2011/0194169 A1 | 8/2011 | Ganti et al. | |
| 2012/0013218 A1* | 1/2012 | Huang | 310/300 |

FOREIGN PATENT DOCUMENTS

| | | |
|---|---|---|
| EP | 0 035 299 | 9/1983 |
| EP | 0 361 981 | 4/1990 |
| EP | 0 668 490 | 8/1995 |
| EP | 0 695 959 | 2/1996 |
| EP | 0 758 080 | 2/1997 |
| EP | 0 879 991 | 11/1998 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 275 997 | 1/2003 |
| EP | 1 403 212 | 3/2004 |
| EP | 1 439 515 | 7/2004 |
| EP | 1 473 581 | 11/2004 |
| EP | 1 928 028 | 6/2008 |
| JP | 56-088111 | 7/1981 |
| JP | 5-49238 | 2/1993 |
| JP | 5-281479 | 10/1993 |
| JP | 08-051230 | 2/1996 |
| JP | 11211999 | 8/1999 |
| JP | 2002-062490 | 2/2000 |
| JP | 2000 147262 | 5/2000 |
| JP | 2001-221913 | 8/2001 |
| JP | 2001 249283 | 9/2001 |
| JP | 2002-221678 | 8/2002 |
| JP | 2003-340795 | 2/2003 |
| JP | 2003 177336 | 6/2003 |
| JP | 2003-315732 | 11/2003 |
| JP | 2004-012642 | 1/2004 |
| JP | 2004-212638 | 7/2004 |
| JP | 2004-212680 | 7/2004 |
| JP | 2005 279831 | 10/2005 |
| JP | 2007 027150 | 2/2007 |
| KR | 2002-010322 | 2/2002 |
| WO | WO 98/14804 | 4/1998 |
| WO | WO 98/43129 | 10/1998 |
| WO | WO 01/53113 | 7/2001 |
| WO | WO 02/24570 | 3/2002 |
| WO | WO 02/063602 | 8/2002 |
| WO | WO 02/071132 | 9/2002 |
| WO | WO 02/086582 | 10/2002 |
| WO | WO 03/105198 | 12/2003 |
| WO | WO 2004/042687 | 5/2004 |
| WO | WO 2005/010566 | 2/2005 |
| WO | WO 2006/035698 | 4/2006 |
| WO | WO 2007/014022 | 2/2007 |
| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO 2008/062363 | 5/2008 |

OTHER PUBLICATIONS

Cacharelis et al., 1997, A Reflective-mode PDLC Light Valve Display Technology, Proceedings of European Solid State Device Research Conference (ESSDERC), pp. 596-599.

Dokmeci et al., Dec. 2004, Two-axis single-crystal silicon micromirror arrays, Journal of Microelectromechanical Systems, 13(6):1006-1017.

Maier et al., 1996, 1.3" active matrix liquid crystal spatial light modulator with 508 dpi resolution, SPIE vol. 2754, pp. 171-179.

IPRP dated Jun. 29, 2011 in PCT/US10/028050.

Billard, Tunable Capacitor, 5th Annual Review of LETI, Jun. 24, 2003, p. 7.

Hohlfeld et al., Jun. 2003, Micro-machined tunable optical filters with optimized band-pass spectrum, 12th International Conference on Transducers, Solid-State Sensors, Actuators and Microsystems, 2:1494-1497.

Mehregany et al., 1996, MEMS applications in optical systems, IEEE/LEOS 1996 Summer Topical Meetings, pp. 75-76.

Miles et al, Oct. 21, 1997, A MEMS based interferometric modulator (IMOD) for display applications, Proceedings of Sensors Expo, pp. 281-284.

Nieminen et al., 2004, Design of a temperature-stable RF MEM capacitor, IEEE Journal of Microelectromechanical Systems, 13(5):705-714.

Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.

ISR and WO dated Feb. 22, 2011 in PCT/US10/028050.

Londergan et al., Advanced processes for MEMS-based displays, Proceedings of the Asia Display 2007, SID, 1:107-112.

Nakagawa et al., Feb. 1, 2002, Wide-field-of-view narrow-band spectral filters based on photonic crystal nanocavities, Optics Letters, 27(3):191-193.

Qualcomm MEMS Technologies, Inc., May 2008, Interferometric Modulator (IMOD) Technology Overview, White Paper, 14 pp.

Conner, "Hybrid Color Display Using Optical Interference Filter Array," SID Digest, pp. 577-580 (1993).

Feenstra et al., Electrowetting displays, Liquivista BV, 16 pp., Jan. 2006.

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.

Lezec, Submicrometer dimple array based interference color field displays and sensors, Nano Lett. 7(2):329-333, Dec. 23, 2006.

Longhurst, 1963, Chapter IX: Multiple Beam Interferometry, in Geometrical and Physical Optics, pp. 153-157.

Miles, A New Reflective FPD Technology Using Interferometric Modulation, Journal of the SID, 5/4, 1997.

Miles, Interferometric modulation: MOEMS as an enabling technology for high performance reflective displays, Proceedings of SPIE, vol. 4985, pp. 131-139, 2003.

Pape et al., Characteristics of the deformable mirror device for optical information processing, Optical Engineering, 22(6):676-681, Nov.-Dec. 1983.

Taii et al., "A transparent sheet display by plastic MEMS," Journal of the SID 14(8):735-741, 2006.

Tolansky, 1948, Chapter II: Multiple-Beam Interference, in Multiple-bean Interferometry of Surfaces and Films, Oxford at the Clarendon Press, pp. 8-11.

* cited by examiner

DISPLAY DEVICE WITH OPENINGS BETWEEN SUB-PIXELS AND METHOD OF MAKING SAME

BACKGROUND

1. Field of the Invention

This invention relates to electromechanical systems. More particularly, this invention relates to methods and apparatus for improving the performance of electromechanical systems such as interferometric modulators.

2. Description of the Related Art

Electromechanical systems include devices having electrical and mechanical elements, actuators, transducers, sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers or that add layers to form electrical and electromechanical devices. One type of electromechanical systems device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In one aspect, a method of fabricating an electromechanical device is provided. The method comprises providing a substrate, forming a movable structure over the substrate, forming in the movable structure a plurality of electrically isolated columns, and creating at least one slot in at least one of the plurality of columns. The movable structure comprises a first deformable layer and a reflective layer in substantially continuous contact with the first deformable layer, is electrically conductive, and is spaced apart from the substrate by one or more support structures. The columns extend in a first direction. The slot is defined by a first dimension and a second dimension greater than the first dimension, the second dimension extending in a second direction substantially perpendicular to the first direction. In an embodiment of such an aspect, each column comprises a plurality of independently actuatable sub-portions. In another embodiment, the slot is positioned generally between two adjacent sub-portions of a column. In another embodiment, each sub-portion has four corner regions, each corner region being supported by a different support structure. In another embodiment, the method further comprises creating a plurality of slots in at least one of the columns. In another embodiment, a pair of consecutive slots in a column define a sub-portion of the column. In another embodiment, the second dimension extends from a first position near a first support structure to a second position near a second support structure adjacent to the first support structure. In another embodiment, the second dimension is substantially equal to a distance between two adjacent support structures. In another embodiment, the second dimension is slightly greater than a distance between two adjacent support structures. In another embodiment, the slot comprises a plurality of spaced-apart perforations. In another embodiment, creating at least one slot in at least one of the columns is performed at a central portion of the column. In another embodiment, creating at least one slot comprises leaving a portion of movable structure between an end of the slot and an edge of the column. In another embodiment, the columns have generally straight edges. In another embodiment, the method further comprises forming a second deformable layer over the first deformable layer. In another embodiment, the first deformable layer comprises a dielectric material. In another embodiment, the method further comprises depositing a sacrificial layer over the substrate. In another embodiment, the method further comprises patterning the sacrificial layer to form apertures. In another embodiment, the method further comprises forming the support structures at least partially within the apertures in the sacrificial layer. In another embodiment, the method further comprises forming an optical stack over the substrate. In another embodiment, the device comprises a MEMS device. In another embodiment, the device comprises an interferometric modulator.

In another aspect, an electromechanical systems device comprises a substrate and a plurality of deformable electrodes over the substrate. Each deformable electrode comprises a deformable layer and a reflective layer in substantially continuous contact with the deformable layer, each deformable layer extends in a first direction, each deformable electrode is supported along opposing edges by a plurality of supports, and each deformable electrode has at least one opening. Each opening is defined by a first dimension and a second dimension greater than the first dimension, the second dimension extending in a second direction generally perpendicular to the first direction. In an embodiment of such an aspect, the deformable electrodes are physically separated from one another. In another embodiment, the deformable electrodes are electrically isolated from one another. In another embodiment, the opening is disposed generally between independently actuatable sub-portions of the deformable electrode. In another embodiment, each opening extends generally between a pair of the supports. In another embodiment, each opening has a first end and a second end, the first end is disposed over a portion of a first support, the second end is disposed over a portion of a second support. In another embodiment, the second dimension is substantially equal to a distance between a pair of the supports. In another embodiment, the second dimension is slightly greater than a distance between a pair of the supports. In another embodiment, each deformable electrode comprises a plurality of said openings. In another embodiment, a pair of consecutive openings in a deformable electrode defines a sub-portion of the deformable electrode. In another embodiment, the second dimension is selected to substantially eliminate cross-talk between adjacent sub-portions of the deformable electrode. In another embodiment, the device further comprises a second reflective layer disposed over the substrate. In another embodiment, the deformable reflective layer and the second reflective layer define an optical cavity. In another embodiment, the device comprises a MEMS device. In another embodiment, the device comprises an interferometric modulator.

In another aspect, an electromechanical systems device comprises a substrate, means for reflecting light, means for supporting the reflecting means over the substrate, and means for reducing cross-talk between adjacent sub-portions of the reflecting means while maintaining electrical conductivity through the reflecting means. The reflecting means is electrically conductive and deformable towards the substrate. In an embodiment of such an aspect, the means for reducing cross-talk comprises one or more openings in the reflecting means. In another embodiment, the reflecting means comprises a deformable layer. In another embodiment, the reflecting means comprises a dielectric layer. In another embodiment, the supporting means comprises a plurality of supports. In another embodiment, the supporting means are disposed near corner regions of the sub-portions of the reflecting means.

In another aspect, a display device comprises an electromechanical systems device having a substrate and a plurality of deformable electrodes over the substrate. Each deformable electrode comprises a deformable layer and a reflective layer in substantially continuous contact with the deformable layer, each deformable layer extends in a first direction, each deformable electrode is supported along opposing edges by a plurality of supports, and each deformable electrode has at least one opening. Each opening is defined by a first dimension and a second dimension greater than the first dimension, the second dimension extending in a second direction generally perpendicular to the first direction. In an embodiment of such an aspect, the display device further comprises a processor that is configured to communicate with said display, said processor configured to process image data, and a memory device that is configured to communicate with said processor. In another embodiment, the display device further comprises a driver circuit configured to send at least one signal to said display. In another embodiment, the display device further comprises a controller configured to send at least a portion of said image data to said driver circuit. In another embodiment, the display device further comprises an image source module configured to send said image data to said processor. In another embodiment, said image source module comprises at least one of a receiver, transceiver, and transmitter. In another embodiment, the display device further comprises an input device configured to receive input data and to communicate said input data to said processor.

Figure 1:
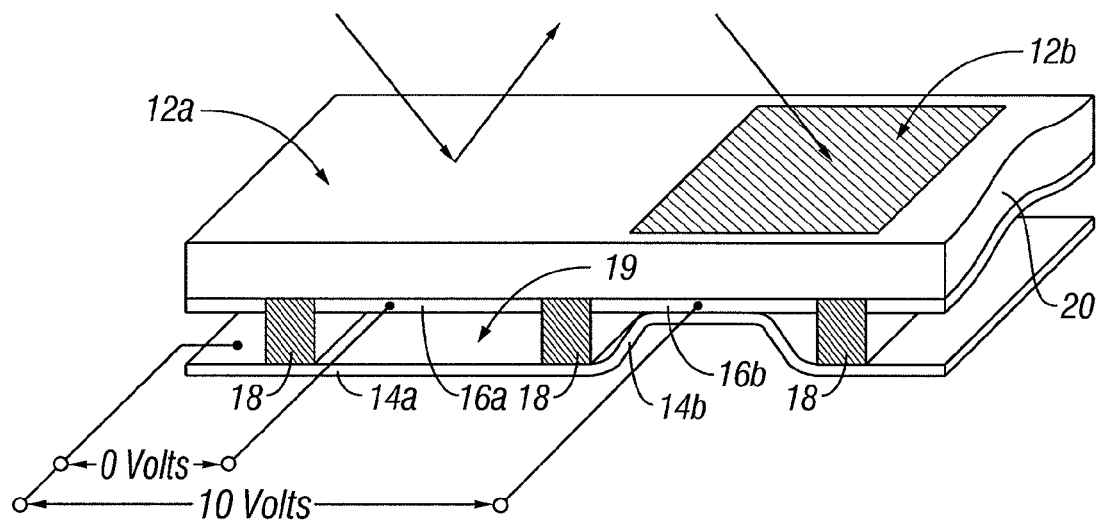
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The Figures are schematic only, and are not drawn to scale.

DETAILED DESCRIPTION OF PREFERRED EMBODIMENTS

The following detailed description is directed to certain specific embodiments. However, the teachings herein can be applied in a multitude of different ways. For example, as will be understood by one of skill in the art, although particular embodiments are described herein in the context of a MEMS interferometric modulator, embodiments of the invention can be used to advantage in other MEMS devices, as well as in NEMS devices. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). Electromechanical devices of similar structure to those described herein can also be used in non-display applications such as in electronic switching devices.

Embodiments described herein provide electromechanical systems devices and particularly interferometric modulator devices and methods of making the same with improved performance. In particular, embodiments for reducing cross-talk between adjacent pixels or sub-pixels in a display are described, as are embodiments for promoting simultaneous release of all edges of a pixel or sub-pixel in a display. In one aspect, an interferometric modulator display includes an electrically conductive deformable layer arranged as substantially parallel strips or columns. In conjunction with row electrodes, the columns define a plurality of individually actuatable sub-pixels of the display. The columns are provided with crosswise slots disposed generally at the boundary regions of each sub-pixel. The crosswise slots can have a length selected to minimize mechanical cross-talk between adjacent sub-pixels of a given column, while maintaining sufficient material connecting the adjacent sub-pixels so as not to significantly degrade the electrical characteristics (including conductivity and capacitance) of the adjacent sub-pixels or the material connecting them. In another aspect, a method of fabricating an electromechanical systems device involves forming a deformable layer having plurality of electrically isolated columns, with one or more crosswise slots in the columns at boundary areas between adjacent sub-pixels in the columns.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
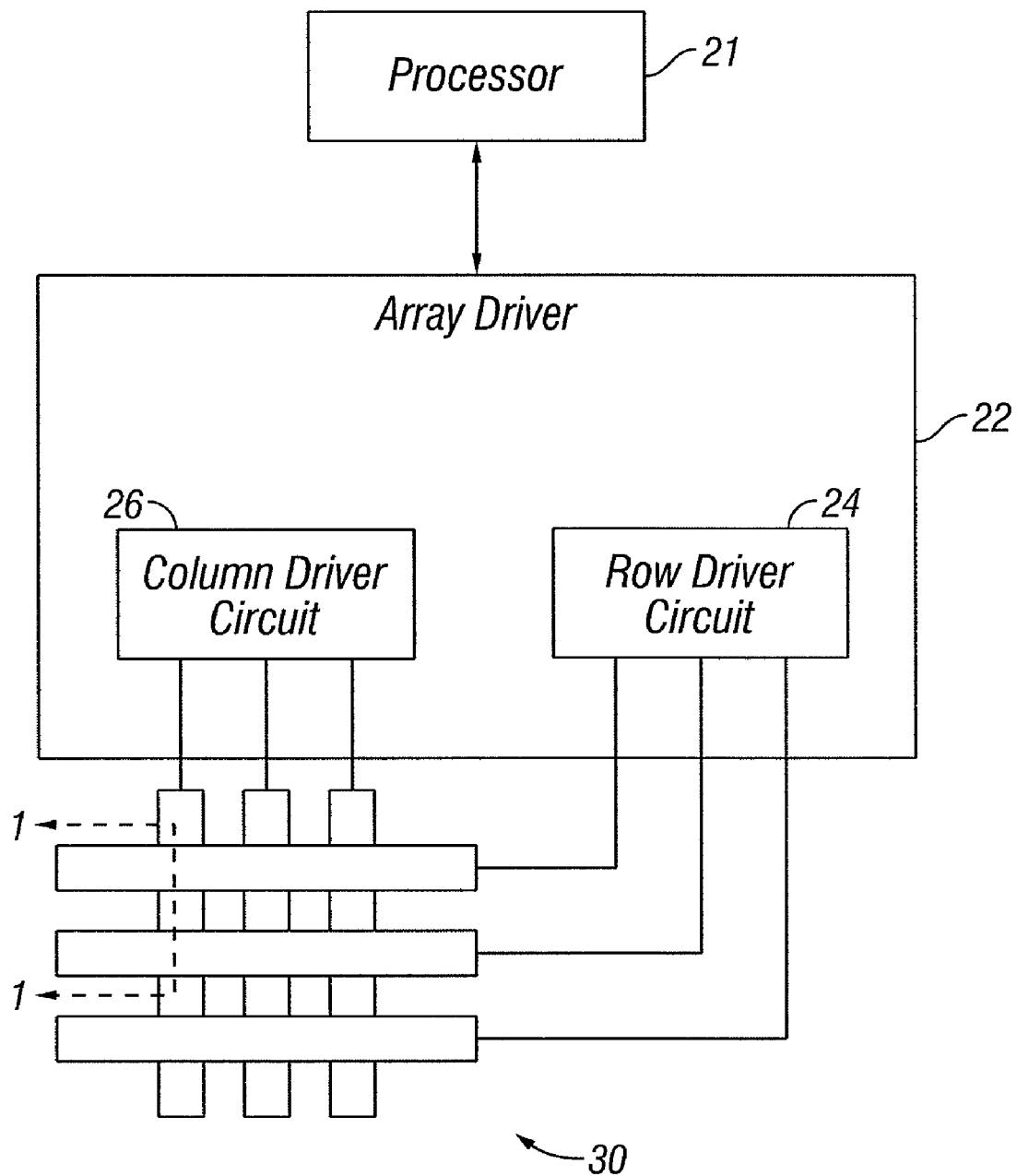
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
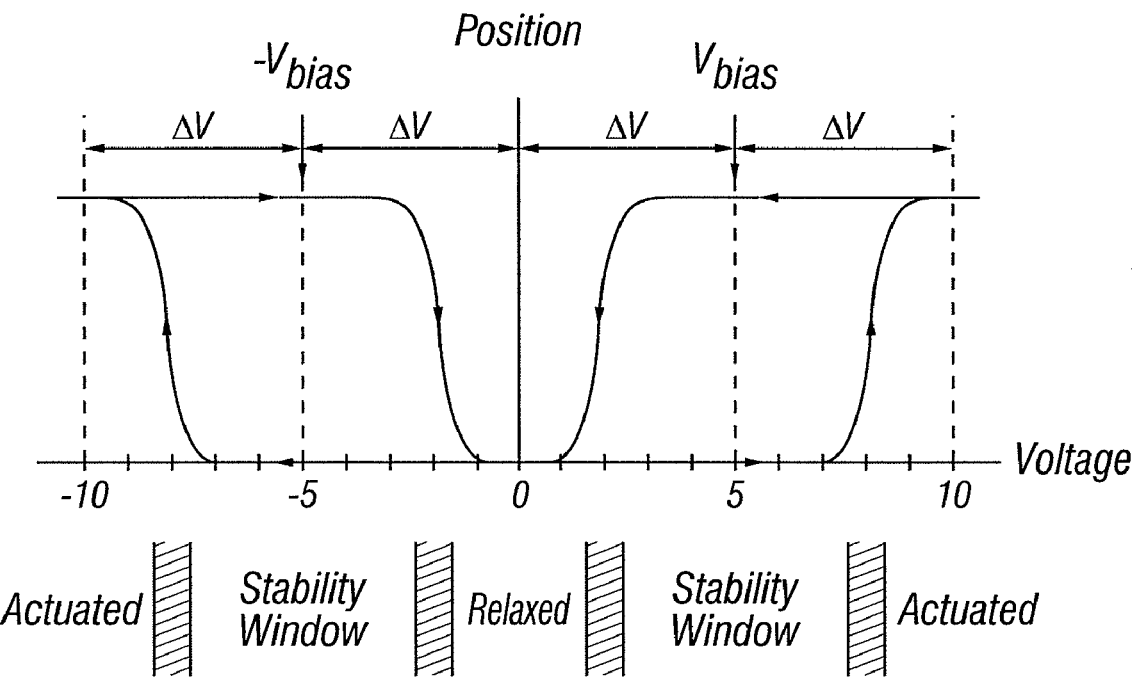
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to −Vbias, and the appropriate row to +ΔV, which may correspond to −5 volts and +5 volts respectively. Relaxing the pixel is accomplished by setting the appropriate column to +Vbias, and the appropriate row to the same +ΔV, producing a zero volt potential difference across the pixel. In those rows where the row voltage is held at zero volts, the pixels are stable in whatever state they were originally in, regardless of whether the column is at +Vbias, or −Vbias. As is also illustrated in FIG. 4, voltages of opposite polarity than those described above can be used, e.g., actuating a pixel can involve setting the appropriate column to +Vbias, and the appropriate row to −ΔV. In this embodiment, releasing the pixel is accomplished by setting the appropriate column to −Vbias, and the appropriate row to the same −ΔV, producing a zero volt potential difference across the pixel.

Figure 5A:
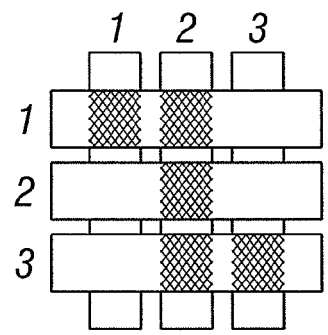
FIGS. 5A and 5B illustrate one exemplary timing diagram for row and column signals that may be used to write a frame of display data to the 3×3 interferometric modulator display of FIG. 2.
Figure 5B:
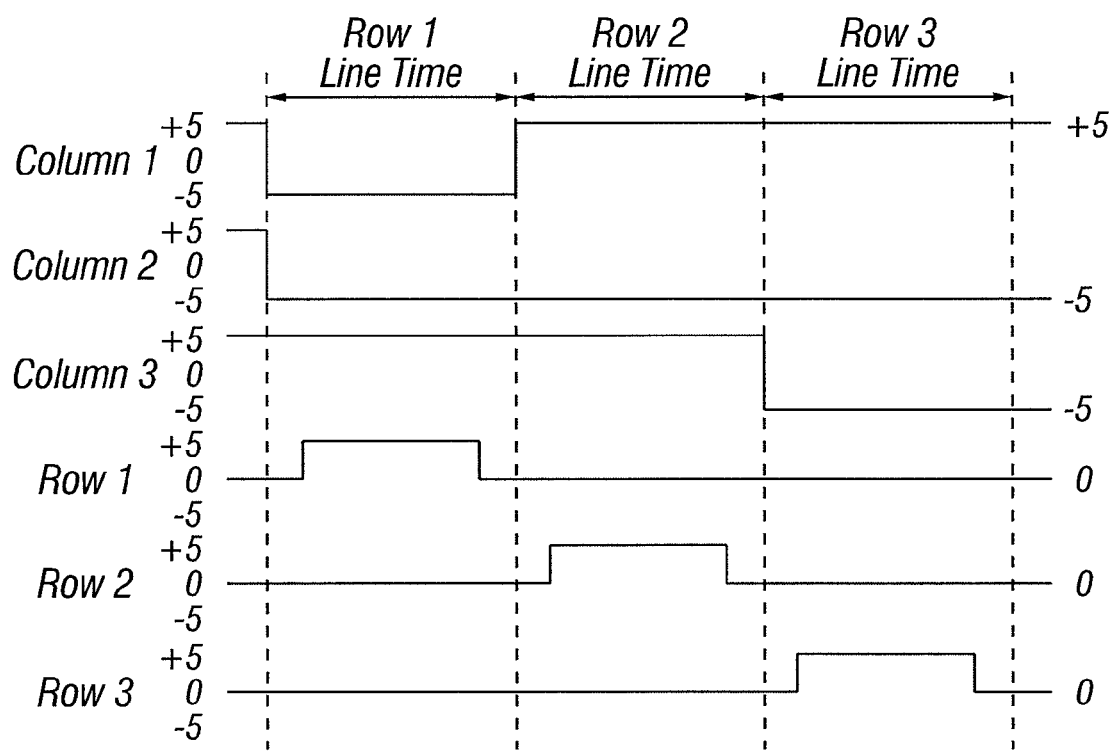

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
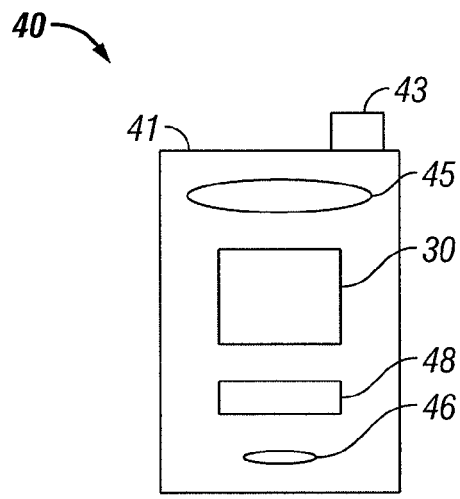
FIGS. 6A and 6B are system block diagrams illustrating an embodiment of a visual display device comprising a plurality of interferometric modulators.
Figure 6B:
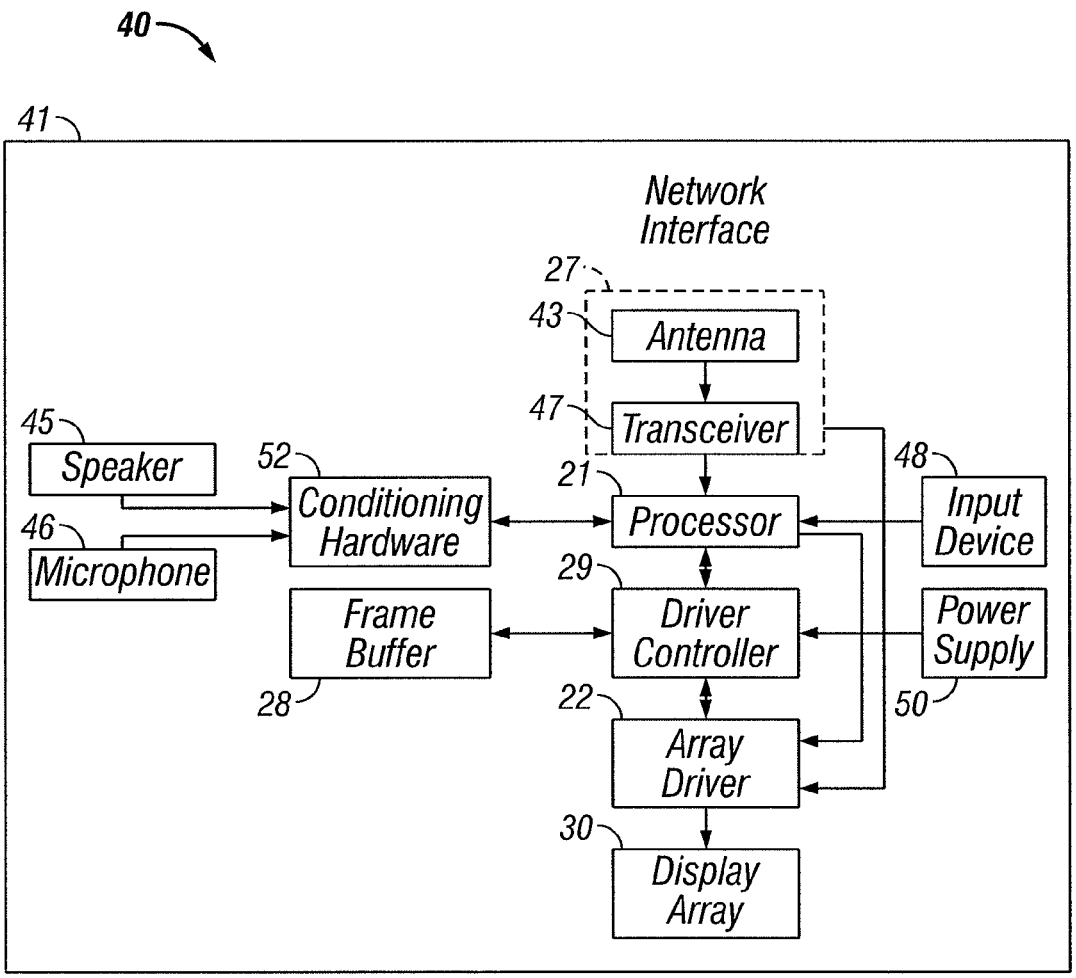

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
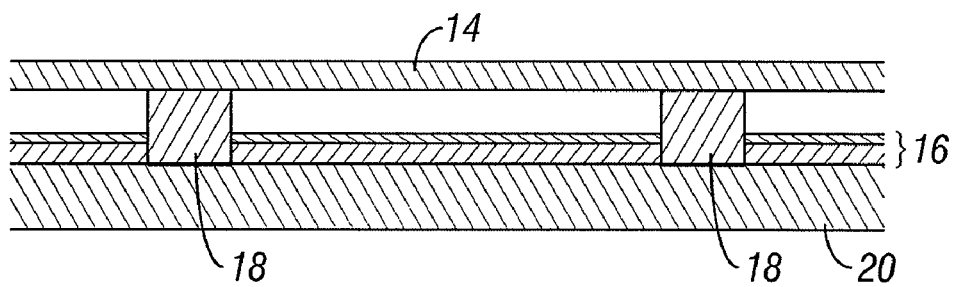
FIG. 7A is a cross section of the device of FIG. 1.
Figure 7B:
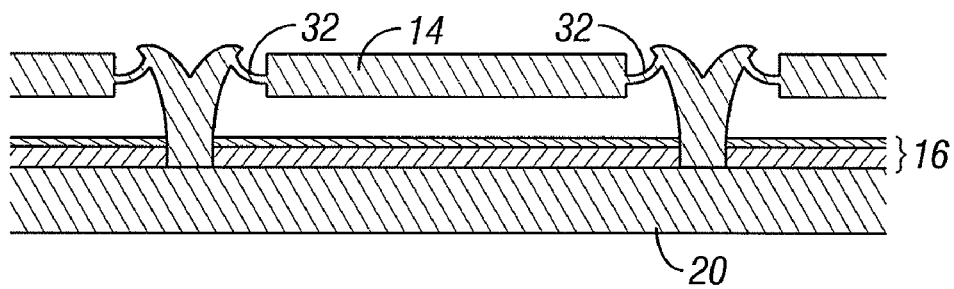
FIG. 7B is a cross section of an alternative embodiment of an interferometric modulator.
Figure 7C:
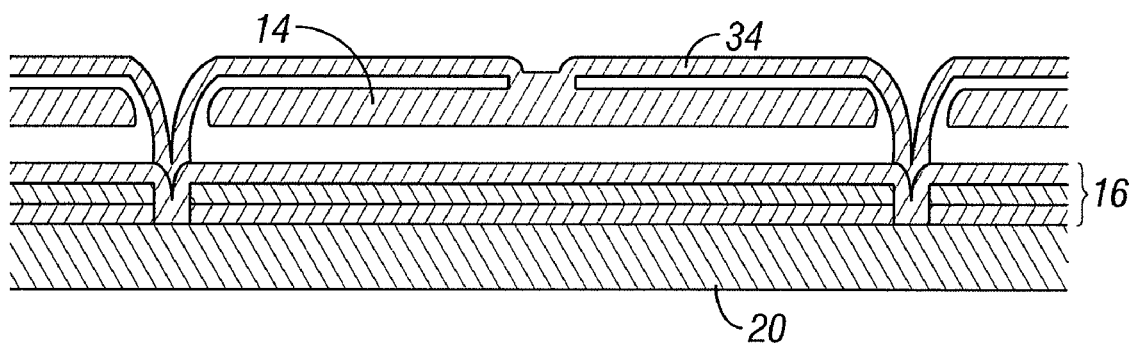
FIG. 7C is a cross section of another alternative embodiment of an interferometric modulator.
Figure 7D:
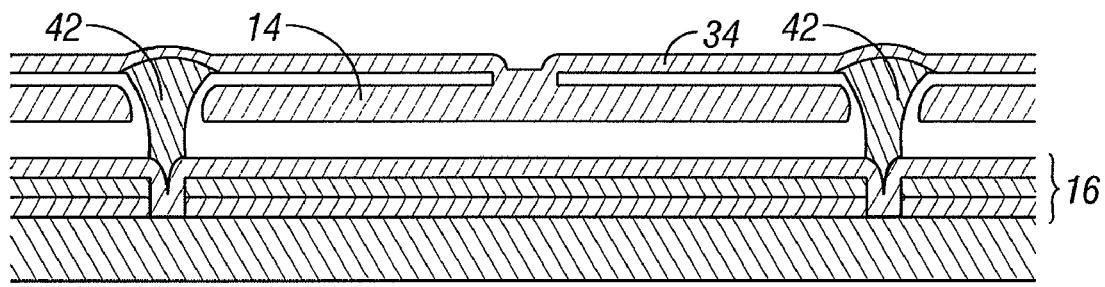
FIG. 7D is a cross section of yet another alternative embodiment of an interferometric modulator.
Figure 7E:
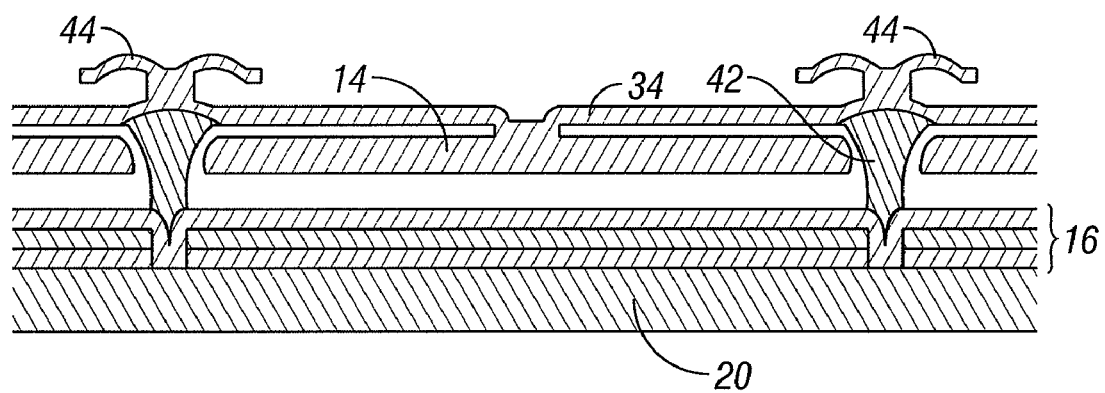
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
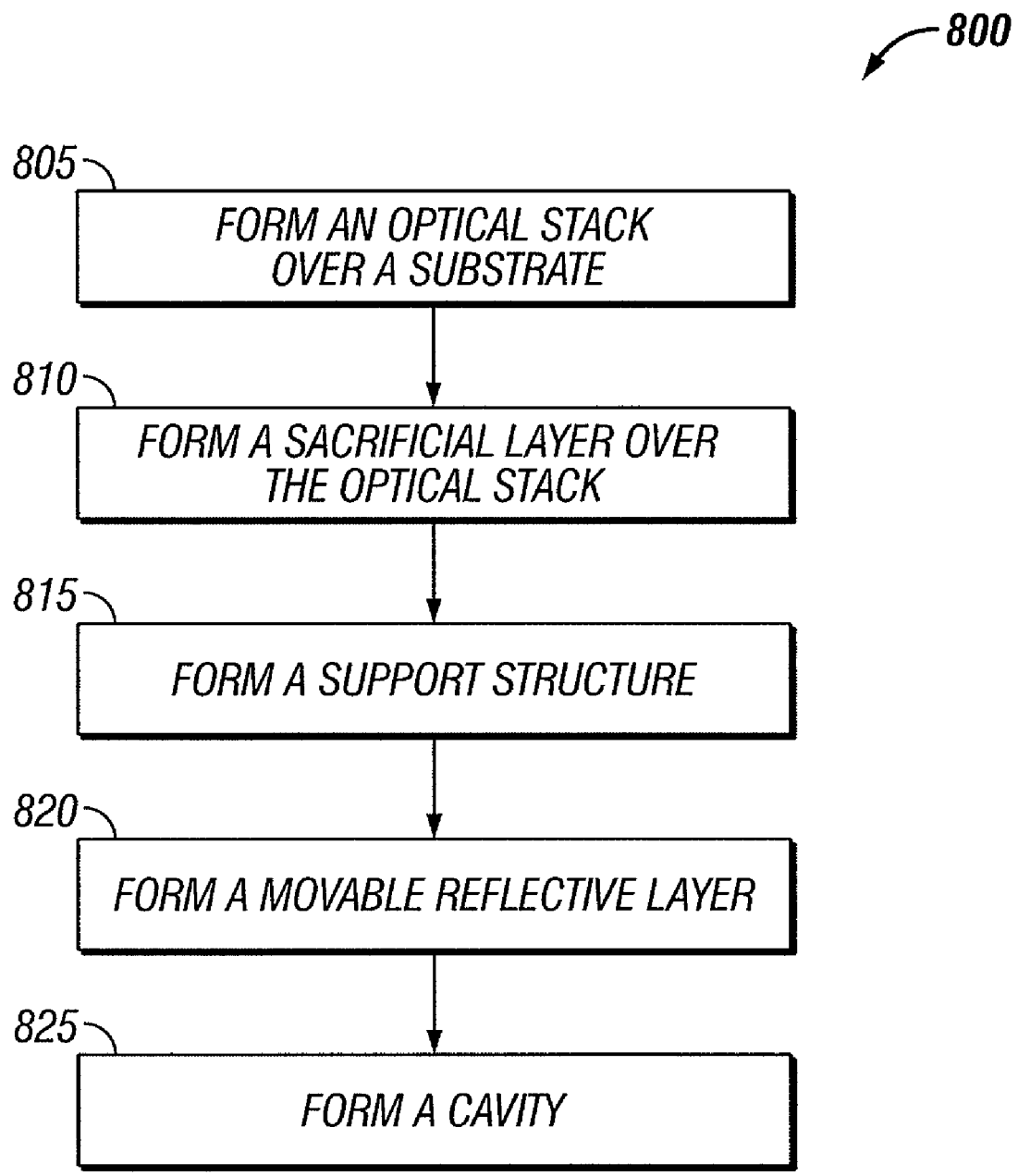
FIG. 8 is a flow diagram illustrating certain steps in an embodiment of a method of making an interferometric modulator.

FIG. 8 illustrates certain steps in an embodiment of a manufacturing process 800 for an optical modulator, such as an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. As used herein, and as will be understood by one of skill in the art, the term "patterned" is used herein to refer to patterning as well as etching processes. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer or a silicon oxide) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer or membrane such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

In some embodiments, a MEMS display can comprise one or more pixels that each comprise a plurality of sub-pixels. Each sub-pixel can comprise an independently movable and/or independently actuatable optical modulator. By such a configuration, a single pixel can be configured to reflect multiple colors, depending on the particular configuration of the individual sub-pixels and the selection of sub-pixels that are actuated. For example, in one embodiment, a MEMS display can be configured with pixels that are divided into nine sub-pixels, with three sub-pixels in a column configured to reflect blue light, three sub-pixels in an adjacent column configured to reflect green light, and three sub-pixels in the next column configured to reflect red light in their unactuated (relaxed) states. In such a configuration, the modulators in the columns of a given pixel can have differently sized air gaps and/or different thicknesses. In such an example, individually actuating different combinations of sub-pixels causes the pixel to reflect different colors.

Figure 9A:
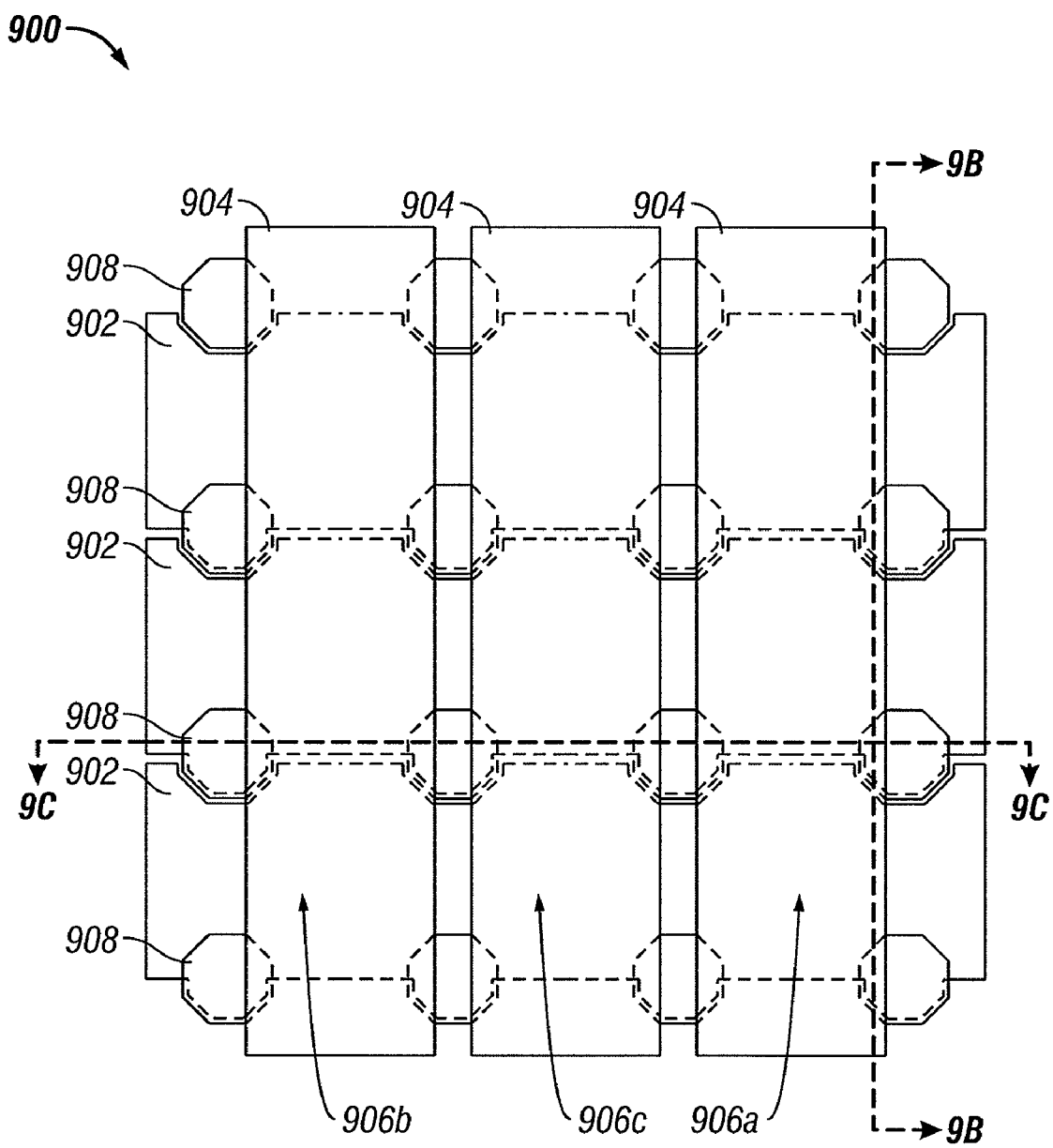
FIG. 9A is a view depicting a portion of one embodiment of an interferometric modulator display.

FIG. 9A is a view depicting a portion of one embodiment of an interferometric modulator display 900 that includes three parallel row electrodes 902 and three strips 904 of a deformable (or otherwise movable) reflective layer, arranged in columns extending perpendicular to the row electrodes 902. In the illustrated embodiment, the overlapping portions of the row electrodes 902 and the column electrodes 904 define nine sub-pixels 906 (comprising three each of sub-pixels 906*a*, 906*b*, and 906*c*). Supports 908 are disposed at corner regions of each sub-pixel, on or near border regions of the row electrodes 902, and are configured to support edge portions of the column electrodes 904. Those skilled in the art will understand that row electrodes can be electrically conductive portions of the optical stack. For example, in some embodiments, reference to row electrodes in this and the following discussion will be understood as a reference to the electrically conductive metal layer(s) (e.g., ITO) of an optical stack, such as the optical stack 16 illustrated in FIGS. 7A-7E. Although some of the drawings depicting the row electrodes may omit other layer(s) of the optical stack (such as a partially reflective layer, and/or one or more transparent dielectric layers) for clarity, those skilled in the art will understand that such other layer(s) may be present as desired for particular applications. Column electrodes can comprise one or more layers which can be light-reflective and electrically conductive, and can be movable towards the optical stack.

Figure 9B:
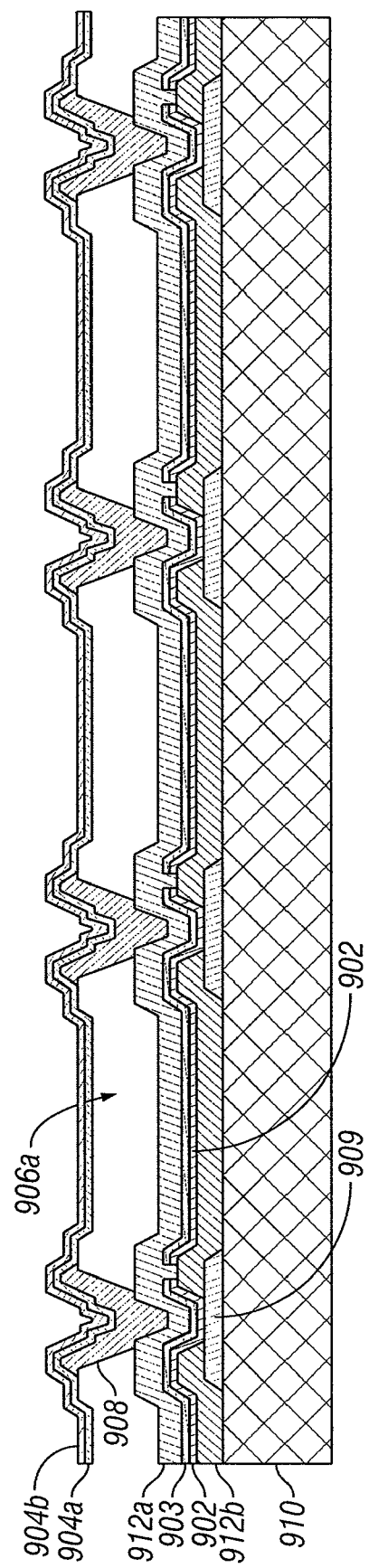
FIG. 9B is a cross section of the device of FIG. 9A, taken along line 9B-9B of FIG. 9A.

FIG. 9B shows a cross-section of a portion of the display 900 illustrated in FIG. 9A, and also shows a substrate 910 underlying the optical stack, which includes row electrodes 902, a partially reflective and partially transmissive layer 903, and dielectric layers 912*a*, 912*b*. Also illustrated in FIG. 9B are optical mask structures 909 underlying the supports 908. The optical mask structures 909, also referred to as "black mask" structures, can be configured to absorb ambient or stray light and to improve the optical response of a display device by increasing the contrast ratio. In some applications, the optical mask can reflect light of a predetermined wavelength to appear as a color other than black. The optical mask structures can also be conductive, and thus can be configured to function as an electrical bussing layer. The conductive bus structures can be configured with a lower electrical resistance than the row and/or column electrodes themselves, to improve the response time of the sub-pixels in an array. A conductive bus structure can also be provided separately from the optical mask structure. A conductive mask or other conductive bus structure can be electrically coupled to one or more of the elements on the display to provide one or more electrical paths for voltages applied to one or more of the display elements. For example, depending on the configuration desired, one or more of the row or column electrodes can be connected to the conductive bus structure to reduce the resistance of the connected row or column electrode. In some embodiments, the conductive bus structures can be connected to the row electrodes 902 through one or more vias (not shown in FIG. 9B), which can be disposed underneath the supports 908 or in any other suitable location.

In some embodiments, the column electrodes 904 can comprise multiple layers. For example, the column electrode 904 illustrated in FIG. 9B comprises a reflective layer 904*a* and a flexible layer 904*b*. In some embodiments, the flexible layer 904*b* can be formed directly over and/or in continuous contact with the reflective layer 904*a*. Depending on the particular application, the flexible layer 904*b* can comprise a dielectric material, a conductive material, or any other suitable material. In some embodiments, the reflective layer 904*a* comprises aluminum.

Figure 9C:
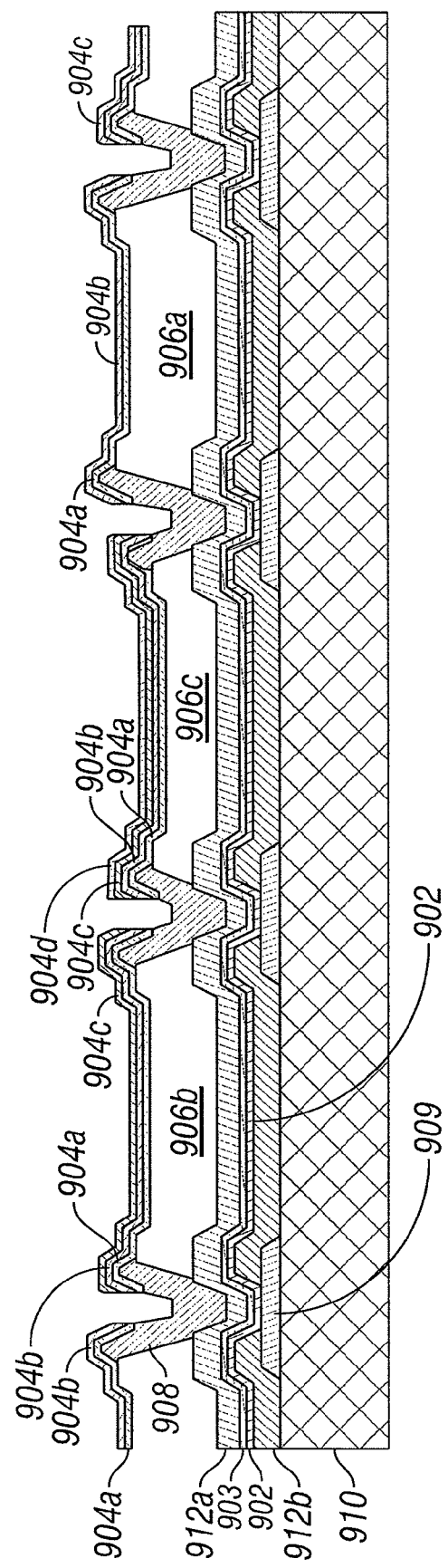
FIG. 9C is a cross section of the device of FIG. 9A, taken along line 9C-9C of FIG. 9A.

In addition, in some embodiments, the columns 904 of a given pixel can have different thicknesses, and/or multiple layers of the same or different thicknesses. For example, as illustrated in FIG. 9C, the column electrode 904 of sub-pixel 906*a* can comprise a single reflective layer 904*a* and a single flexible supporting layer 904*b*. The column electrode 904 of sub-pixel 906*b* can an additional supporting layer 904*c* to increase the stiffness of the sub-pixel 906*b* relative to sub-pixel 906*a*. The column electrode 904 of sub-pixel 906*c* can have yet another supporting layer 904*d* in order to increase the stiffness of the sub-pixel 906*c* relative to sub-pixel 906*b*. The various supporting layers 904*b*, 904*c*, and 904*d* can comprise the same or different material, and can have the same or different thicknesses as required by the particular application. Also in some embodiments, the sub-pixels in a display can be configured with differently sized air gaps between their columns and optical stacks. For example, as shown in FIG. 9C, sub-pixel 906*a* is configured with the relatively largest air gap in the illustrated display, sub-pixel 906*b* has a somewhat smaller air gap, and sub-pixel 906*c* is configured with the relatively smallest air gap in the illustrated display. By such a configuration, the sub-pixels in a display can be configured to reflect various desired colors at similar actuation voltages.

The interferometric modulator display 900 can be manufactured using the method 800 of FIG. 8. The row electrodes 902 can be formed at the step 805 as part of the optical stack.

The row electrodes 902 can be formed in any suitable fashion, for example, they can be formed as a single layer which is then patterned and etched to separate and electrically isolate the rows 902 from one another. The supports 908 can be formed within apertures formed within the sacrificial layer in a region along the periphery of each sub-pixel to support edge portions of the columns 904 of the deformable reflective layer or membrane. The parallel strips 904 of the movable reflective layer can be formed at step 820. The parallel strips 904 can be formed over the sacrificial layer and the supports 908 so as to be supported when the sacrificial layer is removed at step 825. The parallel strips 904 can be initially formed as a single layer which is then patterned and etched to separate and, thus, physically and electrically isolate the column electrodes 904 from one another.

In some cases, MEMS displays having the general configuration shown in FIGS. 9A, 9B, and 9C can exhibit undesirable mechanical cross-talk between adjacent sub-pixels within each column; that is, the state of a particular sub-pixel may be affected by the state of its neighboring sub-pixel(s), resulting in unintended deflection in either or both sub-pixels, which deteriorates the optical performance of either or both sub-pixels. Also, in some cases, MEMS displays having the general configuration shown in FIG. 9 have exhibited undesirable soft release issues; that is, the various edges of an individual sub-pixel may not release from an actuated state all at once, but may instead release at different release voltages, resulting in a smaller useable hysteresis window. For example, if a sub-pixel is actuated and then released, the edges of the sub-pixel which are closest to the adjacent sub-pixels in the same column may release at a lower voltage than its other two edges. The cross-talk and soft release issues exhibited in configurations such as these may be due to varying stiffness of the deformable layer in the row and column directions.

Creating crosswise slots in the columns at or near the sub-pixel boundaries can facilitate independent movement of neighboring sub-pixel regions of the movable reflective layer, thereby reducing mechanical cross-talk between sub-pixels. In addition, creating crosswise slots in the columns improves uniformity of stress states around the edges of a sub-pixel, and therefore promotes simultaneous release of the edges of a sub-pixel. The crosswise slots can thus reduce soft release problems and increase the useable hysteresis window of the display. Further, creating crosswise slots in the column can also improve the uniformity of reflected color across a sub-pixel.

Figure 10A:
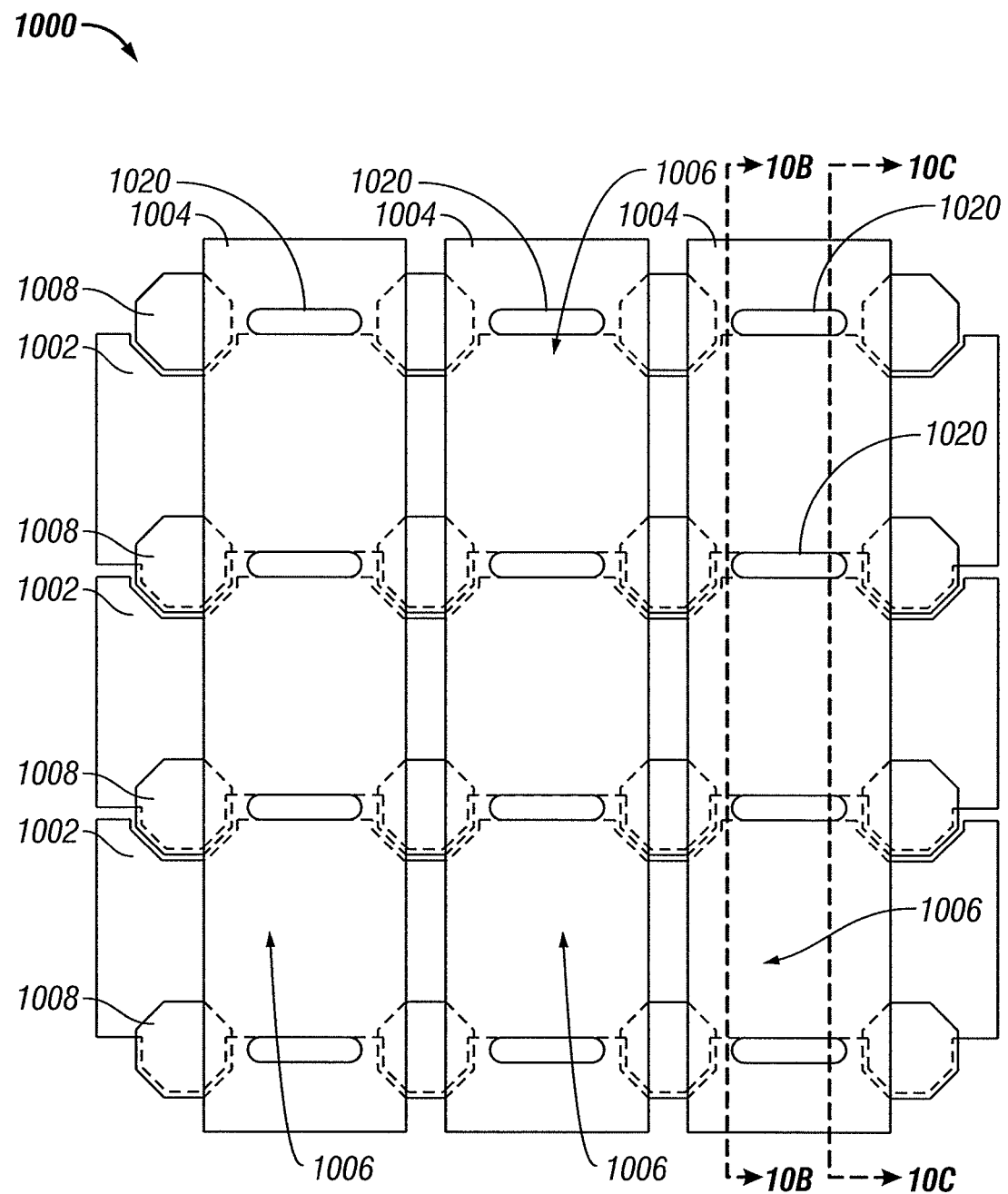
FIG. 10A is a view depicting a portion of another embodiment of an interferometric modulator display, in which slots are provided in the columns at sub-pixel boundaries.

FIG. 10A is a view depicting a portion of one embodiment of an interferometric modulator display 1000 that includes three parallel row electrodes 1002 and three strips 1004 of a deformable reflective layer, arranged in columns extending perpendicular to the row electrodes 1002. In the illustrated embodiment, the overlapping portions of the row electrodes 1002 and the columns 1004 define nine sub-pixels 1006. Although not illustrated, it will be understood that the row electrodes 1002 and the columns 1004 can extend in both longitudinal and lateral directions to connect multiple pixels in an array. Within the illustrated pixel, supports 1008 are disposed at corner regions of each sub-pixel, on or near border regions of the row electrodes 1002. The supports 1008 are configured to support edge portions of the columns 1004. The supports 1008 can have a generally octagonal-shaped cross-section, as shown in the figure. Alternatively, the supports 1008 can have any other suitably-shaped cross section, for example, circular, oval, rectangular, diamond-shaped, or square.

As can be seen in FIG. 10A, openings or slots 1020 are provided in each of the columns 1004. The crosswise slots 1020 can have a width (or first) dimension and a length (or second) dimension, the length dimension greater than their width dimension, and be formed such that the length dimension can extend in a direction generally perpendicular to the direction in which the columns 1004 extend. In some embodiments the length dimension extends substantially or exactly perpendicular to the direction in which the columns 1004 extend. The slots 1020 can be created in the boundary regions between adjacent sub-pixels of a given column 1004, generally between each pair of supports 1008 that support the edges of the column 1004. By making the columns discontinuous at the boundary regions between adjacent sub-pixel regions of the deformable layer within each strip, mechanical cross-talk between sub-pixels can be successfully mitigated.

As shown in the figure, the slots 1020 can comprise generally elongate openings extending between the two edges of a particular column 1004. The slots 1020 can be generally rectangular, generally oblong, or can have any other suitable configuration for their intended purpose. The slots 1020 can have a length selected to substantially eliminate mechanical cross-talk between adjacent sub-pixels in the column 1004, while leaving a sufficient amount of material connecting the adjacent sub-pixels so as not to degrade the electrical characteristics of the display (such as, for example, conductivity or capacitance of the column 1004). The slots 1020 can have a width substantially similar to the lateral spacing between the columns 1004, or can have any other width consistent with their intended purpose. In some embodiments, as illustrated in FIG. 10A, the slots 1020 are created in a central (or middle) region between parallel edges of the column 1004, leaving material of the deformable layer extending along the edges of the column 1004 at both ends of the slots 1020.

Figure 10B:
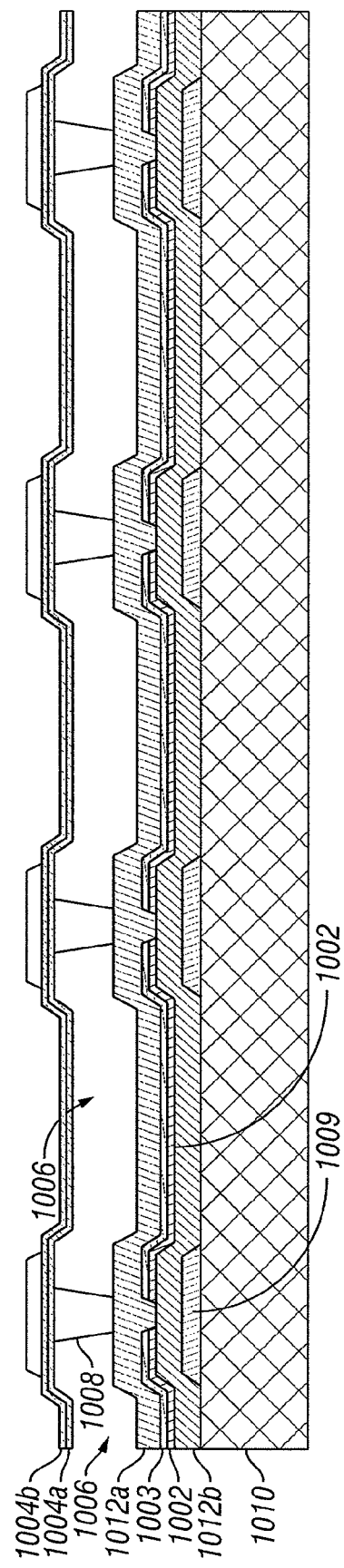
FIG. 10B is a cross section of the device of FIG. 10A, taken along line 10B-10B of FIG. 10A.
Figure 10C:
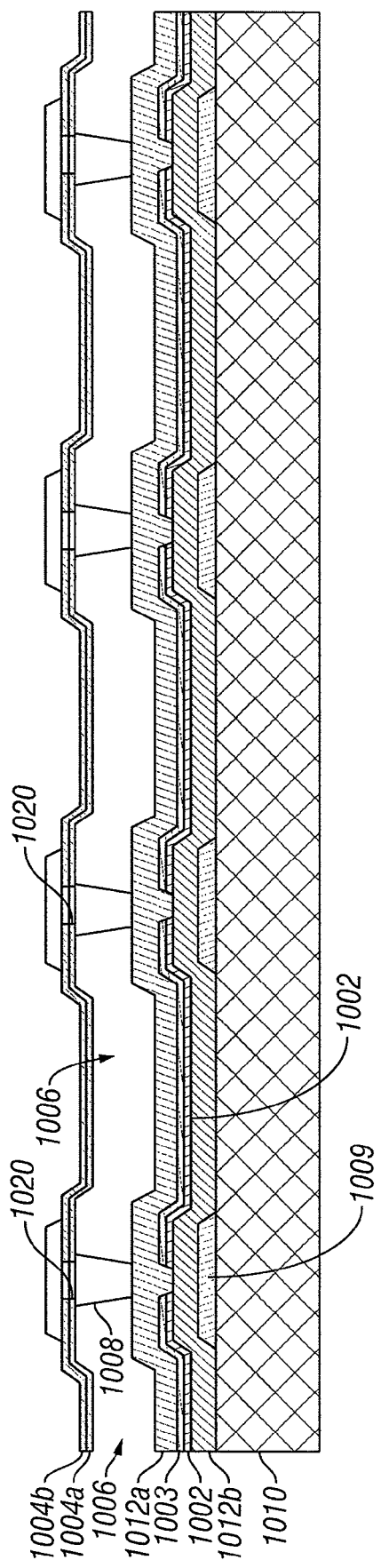
FIG. 10C is a cross section of the device of FIG. 10A, taken along line 10C-10C of FIG. 10A.

FIGS. 10B and 10C show different cross-sections through the display 1000 illustrated in FIG. 10A. FIGS. 10B and 10C additionally show a substrate 1010 underlying the optical stack, which includes row electrodes 1002, a partially reflective and partially transmissive layer 1003, and dielectric layers 1012a, 1012b. FIG. 10B is taken through an edge portion of the column 1004, away from the slots 1020. As can be seen in FIG. 10B, the column 1004 has a multi-layer structure that includes a reflective layer 1004a and a flexible supporting layer 1004b. Also, the material comprising the column 1004 (including the layers 1004a, 1004b) is continuous through the illustrated portion. FIG. 10C, on the other hand, is taken through a center portion of the column 1004, and runs through the slots 1020. As can be seen in FIG. 10C, the material comprising the column 1004 (including the layers 1004a, 1004b) is discontinuous through the illustrated portion at locations near the supports 1008.

Figure 11:
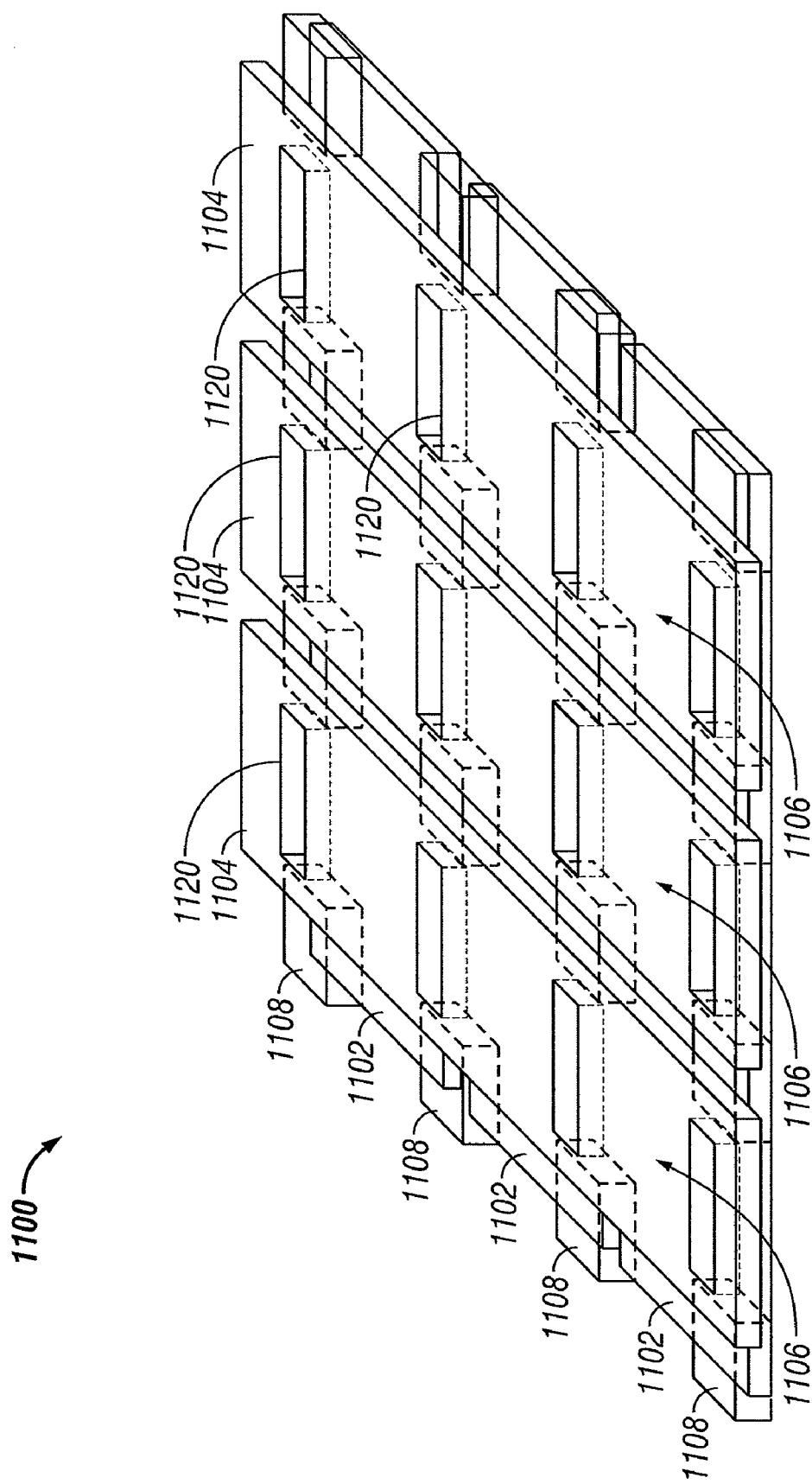
FIG. 11 is a perspective view of a portion of a display according to another embodiment.

FIG. 11 is a perspective view illustrating a display 1100 according to another embodiment, comprising row electrodes 1102 and electrically conductive, deformable columns 1104 defining a number of sub-pixels 1106. Supports 1108 are disposed generally between the row electrodes 1102 and the columns 1104. The illustrated supports 1108 have a generally rectangular-shaped cross section. A plurality of crosswise slots 1120 are provided in each of the columns 1104 to at least partially mechanically separate the adjacent sub-pixels 1106 in each column 1104, while maintaining an adequate electrical connection through the column 1104. As shown in the figure, the slots 1120 can be disposed about centrally between the supports 1108, so as to leave about an equal amount of material in the deformable layer connecting the adjacent sub-pixels 1106 on either end of the slots 1120. This may help maintain consistent electrical properties (e.g., impedance) throughout the deformable layer. However, in some embodiments, the slots can be placed off-center so as to leave a different amount of material in the deformable layer between each end of the slot and each edge of the column.

Figure 12A:
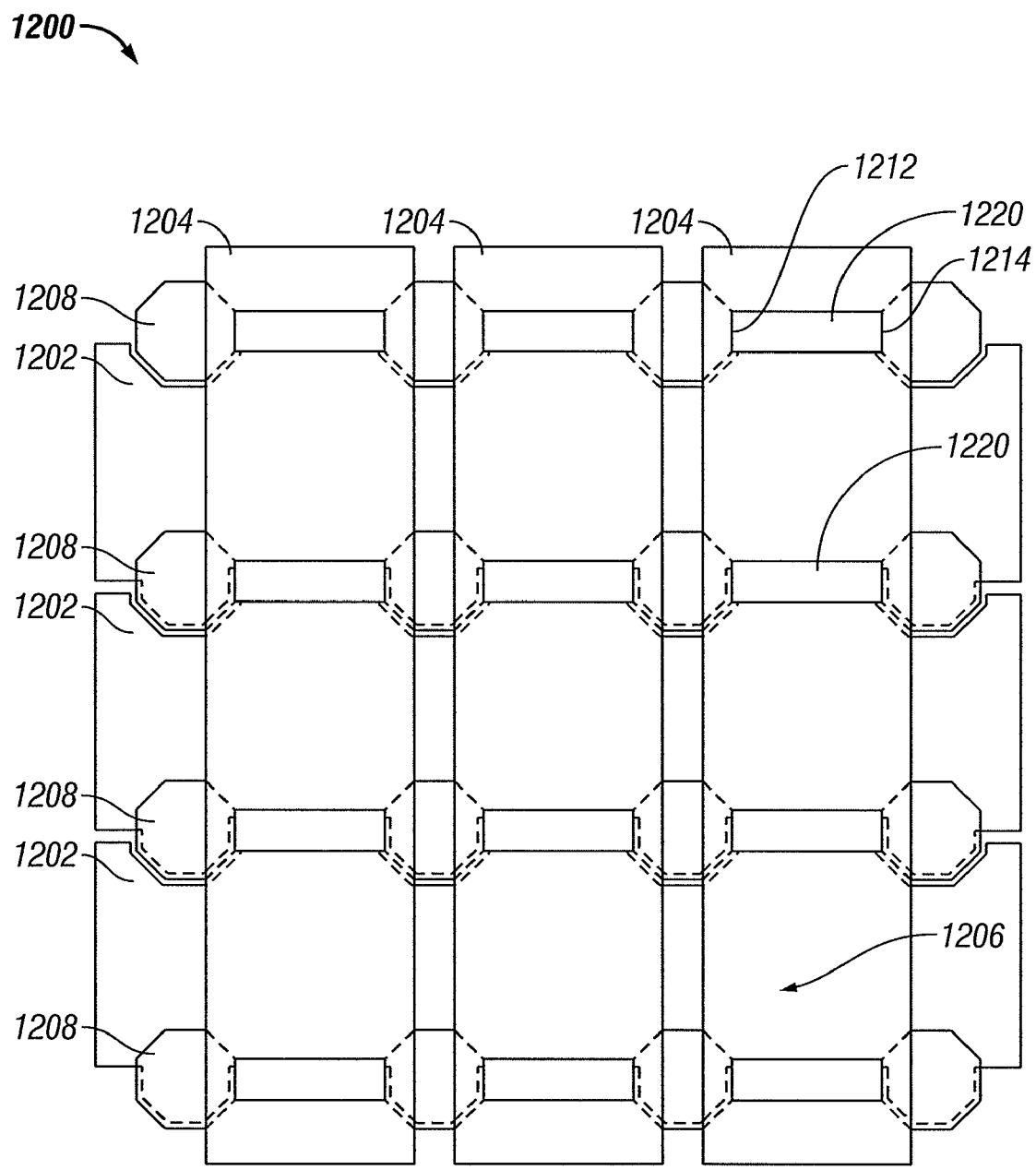
FIG. 12A is a view depicting a portion of a further embodiment of an interferometric modulator display.

FIG. 12A is a top plan view illustrating a display 1200 according to another embodiment, comprising row electrodes 1202 and electrically conductive, deformable columns 1204 defining a number of sub-pixels 1206. Supports 1208 are disposed generally between the row electrodes 1202 and the columns 1204. A plurality of crosswise slots 1220 are provided in each of the columns 1204 to at least partially mechanically separate the adjacent sub-pixels 1206 in each column 1204, while maintaining an adequate electrical connection through the column 1204. In the embodiment illustrated in FIG. 12, the slots 1220 have a length which extends approximately from an edge 1212 of a first support 1208 to an edge 1214 of a second support 1208, thereby leaving a connecting portion of the deformable column 1204 over each support 1208 (between the ends of the slots 1220 and the edges of the column 1204) to connect the deformable column between each sub-pixel 1206. In some embodiments, the slots can have a length slightly greater than a distance between two of the supports 1220—that is, the slots can be dimensioned such that the ends of the slots 1220 extend slightly over the edges 1212, 1214 of two adjacent supports 1208. The slots 1220 can be dimensioned so as to maximize the mechanical separation of adjacent sub-pixels 1206 in each column 1204, while avoiding potential problems that may result if too narrow a strip of material remains along the edges of the column 1204. Such problems can include the possibility of complete discontinuity in the mechanical layer due to process variation, as well as increased resistance of the column 1204. For example, the slots can be dimensioned so as to leave about 2 µm of material between each end of the slot 1220 and the edges of the column 1204. In other embodiments, the slots can be dimensioned so as to leave more than about 2 µm of material between each end of the slot 1220 and the edges of the column 1204; for example, the slots can be dimensioned to leave about 3 µm of material between each end of the slot 1220 and the edges of the column.

In some embodiments, the supports (or support posts) are configured so as to effect generally the same stiffness in the movable layer across both column and slot directions of a sub-pixel. For example, in one embodiment, the sub-pixel shape is a square which has generally the same length in both the column and slot directions. In such an embodiment, the support posts can have a generally symmetrical configuration in both the column and slot directions. Examples of such shapes include square, octagonal, and circular shapes. In another embodiment, the sub-pixel shape is a rectangle which has a longer length along one direction than the other direction. In such an embodiment, the support posts can be configured with dimensions which vary across the two directions. Examples of such shapes include rectangular and oblong shapes. Depending on the pixel arrangement, square and diamond posts are also possible. The shape of the support posts can also be selected with process considerations in mind. For example, in some embodiments, the post can be rectangular shape with its longer dimension extending in the direction of the slots. In such an embodiment, the length of the slot can be relatively smaller, leaving relatively more material connecting adjacent sub-pixels in the same column.

Figure 12B:
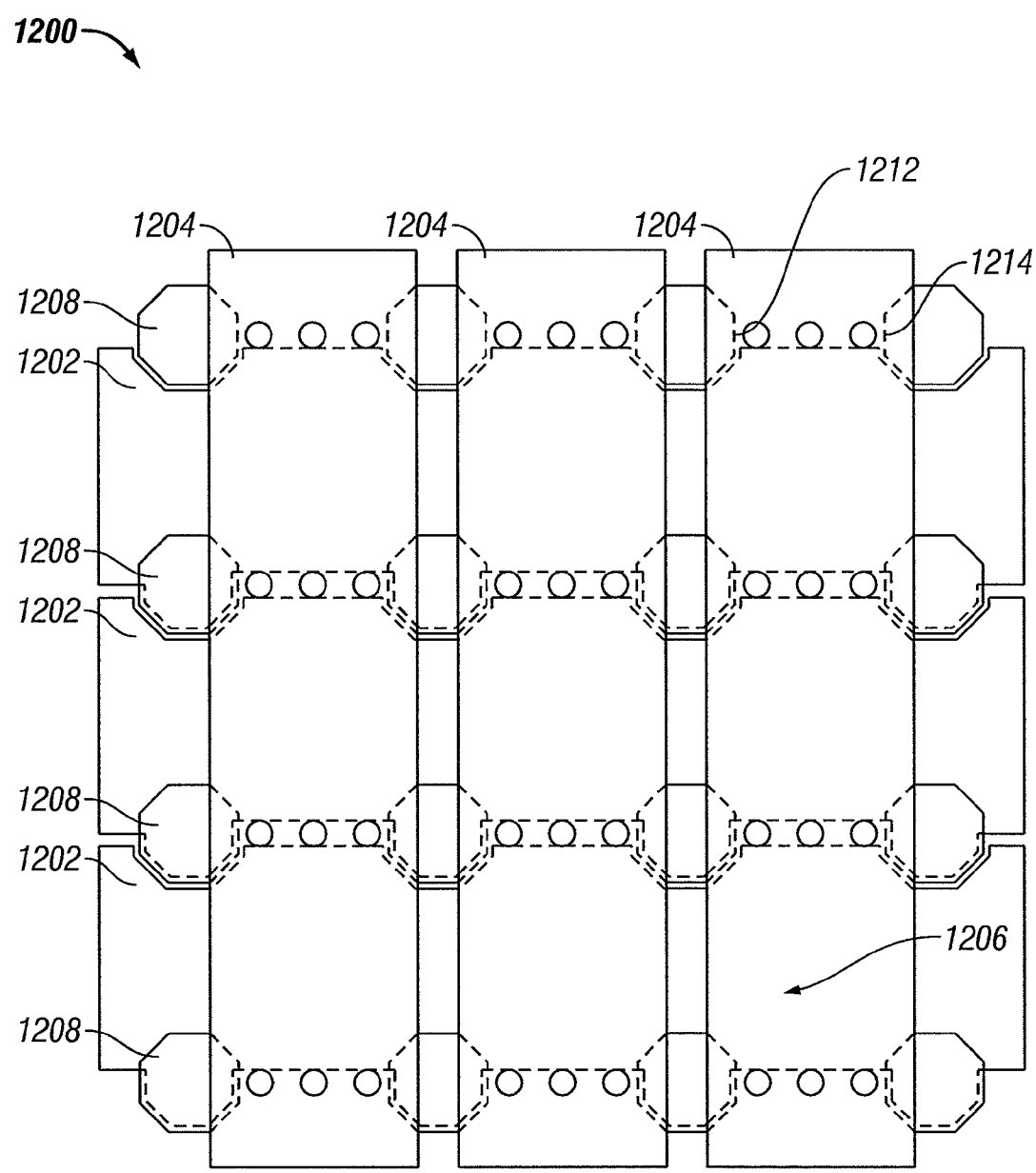
FIG. 12B is a view depicting a portion of a still further embodiment of an interferometric modulator display.

In some embodiments, a plurality of openings can be provided at each boundary region between adjacent sub-pixels in order to decrease the mechanical connection between the adjacent sub-pixels. For example, a series of perforations or holes (two, three, or more) can be created in the deformable layer between two supports supporting either edge of the column. The holes may be circular, or oblong, in some embodiments. The series can extend in a generally perpendicular direction to the direction in which the columns extend. FIG. 12B, for example, shows a display 1201 according to an embodiment. The display 1201 includes generally the same features as display 1200 of FIG. 12A, including row electrodes 1202 and electrically conductive, deformable columns 1204 defining a number of sub-pixels 1206. In FIG. 12B, however, a series of holes 1221 are provided at the boundary regions between adjacent sub-pixels 1206. Each series of holes 1221 has a length greater than the width of the holes 1221, and thus forms a slot extending generally perpendicular to the direction in which the columns 1204 extend. Each series of holes 1221 can extend generally between the edges 1212, 1214 of adjacent supports 1208, in order to partially mechanically separate the adjacent sub-pixels and improve the performance of the display 1201.

Adding crosswise slots at the boundary regions between adjacent sub-pixels in a column can serve to make the entire sub-pixel structure more symmetric, which results in balanced stiffness among both the lengthwise and crosswise edges of the sub-pixel (that is, among the edges separating the individual columns and the edges near the slots). Such a configuration can reduce sub-pixel soft release problems and significantly increase the useable hysteresis window. The slots have the additional advantage of facilitating faster air flow through the deformable layer during sub-pixel actuation, thereby serving to reduce potential damping cross-talk and increase sub-pixel response time for fast actuation. In addition, as will be understood by one of skill in the art, adding slots as described herein can provide these and other benefits without additional masks, process steps or fabrication cost. The crosswise slots can be easily implemented during fabrication of the display, for example during the same process step in which mechanical cuts are made in the deformable layer to create the columns. For example, with reference to FIG. 8, the crosswise slots can be formed in the deformable layer at step 820 of the process 800.

Figure 13:
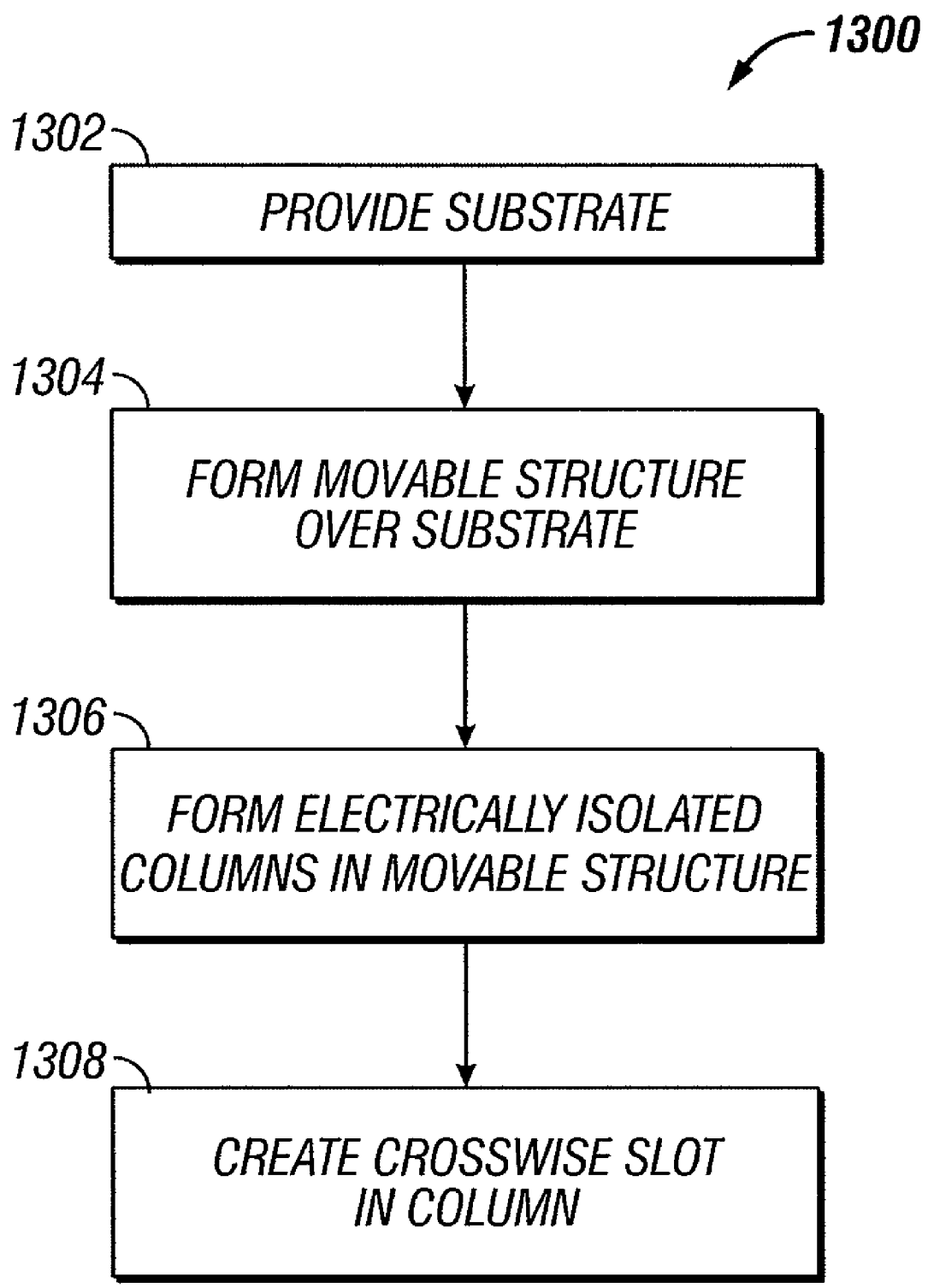
FIG. 13 is a flow diagram illustrating certain steps in another embodiment of a method of making an interferometric modulator.

With reference now to FIG. 13, certain steps in an embodiment of a manufacturing process 1300 for a MEMS device are illustrated. Such steps may be present in a process for manufacturing, e.g., interferometric modulators of the general types illustrated in FIGS. 10 through 12, along with other steps not shown in FIG. 13. With reference to FIG. 13, the process 1300 begins at step 1302 with providing a substrate. The substrate may be a transparent substrate such as glass or plastic, or a non-transparent substrate such as silicon, and may have been subjected to prior preparation step(s), e.g., cleaning, to facilitate efficient formation of an optical stack as described elsewhere herein.

The process 1300 illustrated in FIG. 13 continues at step 1304 with the formation of a movable structure over the substrate. The movable structure can include a reflective layer and at least one deformable layer, such as the reflective layer 1004a and the deformable layer 1004b illustrated in FIG. 10B. The reflective layer can be formed so as to be in substantially continuous contact with the deformable layer. The movable structure can be electrically conductive, and can be spaced apart from the substrate by one or more support structures, such as the supports 1008 illustrated in FIG. 10B. The supports can be formed or placed over the substrate in any suitable fashion, and can have any suitable configuration consistent with their intended purpose.

The process 1300 illustrated in FIG. 13 then moves to step 1306, during which electrically isolated columns are formed in the movable structure. At step 1308, one or more crosswise slots are created in one or more of the columns. Creating the slots can involve patterning and etching the columns so as to partially physically separate adjacent sub-portions within each column. The slots created at step 1308 can extend in a generally crosswise direction in the columns; that is, in a generally perpendicular direction to the direction in which the columns extend. In some embodiments, steps 1306 and 1308 can be implemented at the same time, for example using the same mask. In other embodiments, steps 1306 and 1308 can be implemented sequentially.

Figure 14:
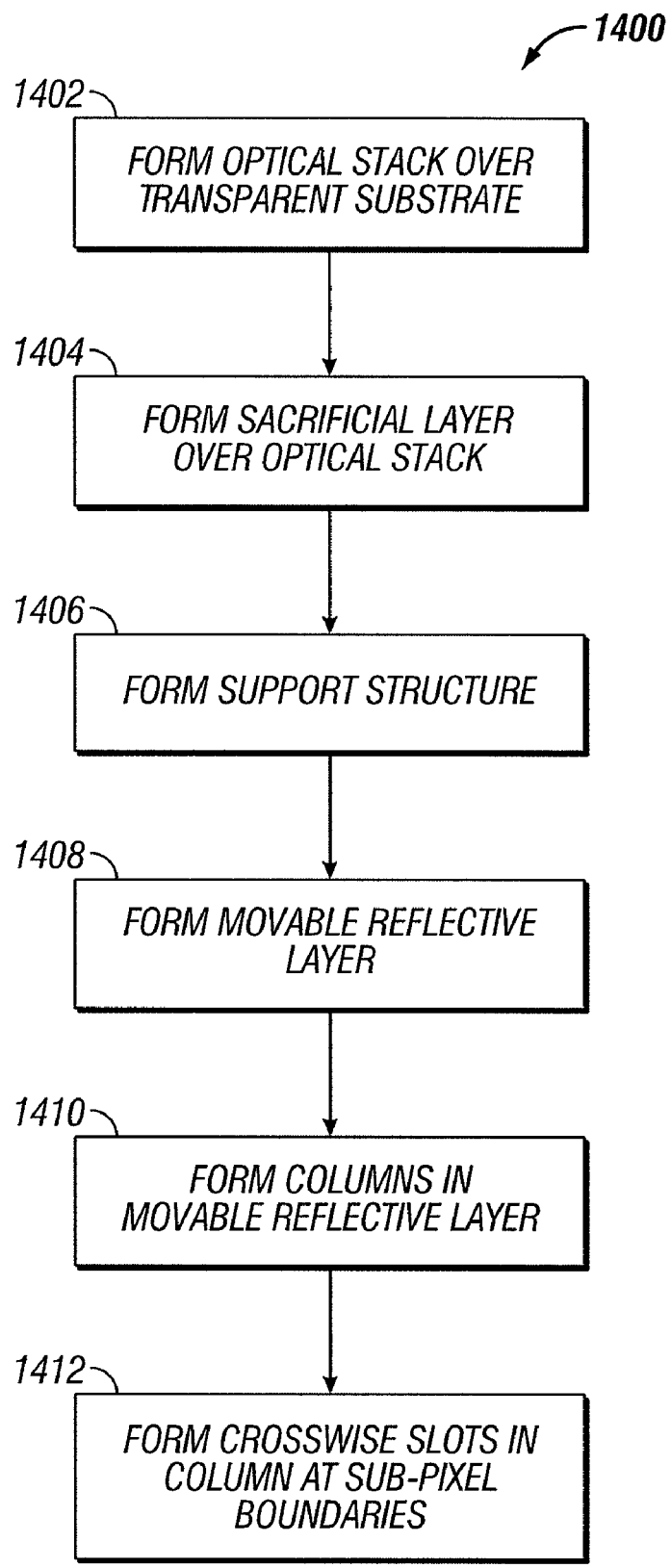
FIG. 14 is a flow diagram illustrating certain steps in a further embodiment of a method of making an interferometric modulator.

With reference now to FIG. 14, certain steps in an embodiment of a manufacturing process 1400 for a MEMS device are illustrated. The MEMS device resulting from such a process can be an optical modulator, such as an interferometric modulator. The process 1400 begins at step 1402 with the formation of an optical stack over a substrate. The substrate can be a transparent substrate such as glass or plastic and may have been subjected to prior preparation step(s), e.g., cleaning, to facilitate efficient formation of the optical stack. As discussed above, the optical stack is electrically conductive, partially transparent and partially reflective, and may be fabricated, for example, by depositing one or more of the layers onto the transparent substrate. In some embodiments, the layers are patterned to form parallel strips, and may form row electrodes in a display device. In some embodiments, the optical stack includes an insulating or dielectric layer that is deposited over one or more metal layers (e.g., reflective and/or conductive layers).

The process 1400 illustrated in FIG. 14 continues at step 1404 with the formation of a sacrificial layer over the optical stack. The sacrificial layer is later removed to form the cavity as discussed herein, and thus the sacrificial layer is not shown in some of the interferometric modulators illustrated in FIGS. 10 and 12, for example. The formation of the sacrificial layer over the optical stack may include deposition of a $XeF_2$-etchable material such as molybdenum or amorphous silicon, in a thickness selected to provide, after subsequent removal, a cavity having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 1400 illustrated in FIG. 14 continues at step 1406 with the formation of a support structure e.g., a support 1008 as illustrated in FIG. 10. The formation of the support 1008 may include the steps of patterning the sacrificial layer to form a support structure aperture, then depositing a material (e.g., a polymer or a silicon oxide) into the aperture to form the support, using a deposition method such as PECVD, thermal CVD, or spin-coating. In some embodiments, the support structure aperture formed in the sacrificial layer extends through both the sacrificial layer and the optical stack to the underlying substrate, so that the lower end of the post contacts the substrate as illustrated in FIG. 7A. In other embodiments, the aperture formed in the sacrificial layer extends through t the sacrificial layer, but not through the optical stack. For example, FIG. 7D illustrates the lower end of the support post plugs 42 in contact with the optical stack 16.

The process 1400 illustrated in FIG. 14 continues at step 1408 with the formation of a movable reflective layer or membrane such as the electrically conductive deformable layer illustrated in FIGS. 1 and 7A. The movable reflective layer may be formed by employing one or more deposition steps, e.g., reflective layer (e.g., aluminum, aluminum alloy) deposition, along with one or more patterning, masking, and/or etching steps. Since the sacrificial layer is still present in the partially fabricated interferometric modulator formed at step 1408 of the process 1400, the movable reflective layer may not be deformable or otherwise movable at this stage.

The process 1400 illustrated in FIG. 14 continues at step 1410 with the formation of columns in the movable reflective layer. This step can involve removal of one or more portions of the movable reflective layer to form physically and electrically separated columns, such as the columns 1004 illustrated in FIG. 10, which extend in a generally perpendicular direction to the row electrodes formed in step 1402. As described herein, the overlapping regions of the columns and rows form sub-pixels of the device. The process 1400 then moves to step 1412, during which crosswise slots are formed in each column at the boundaries of the sub-pixels within each column. The slots can be created in center regions of each column, so as to leave a strip of continuous material running along both edges of each column. In some embodiments, steps 1410 and 1412 are performed simultaneously, for example using the same mask. In other embodiments, the steps 1410 and 1412 can also be performed sequentially.

Figure 15A:
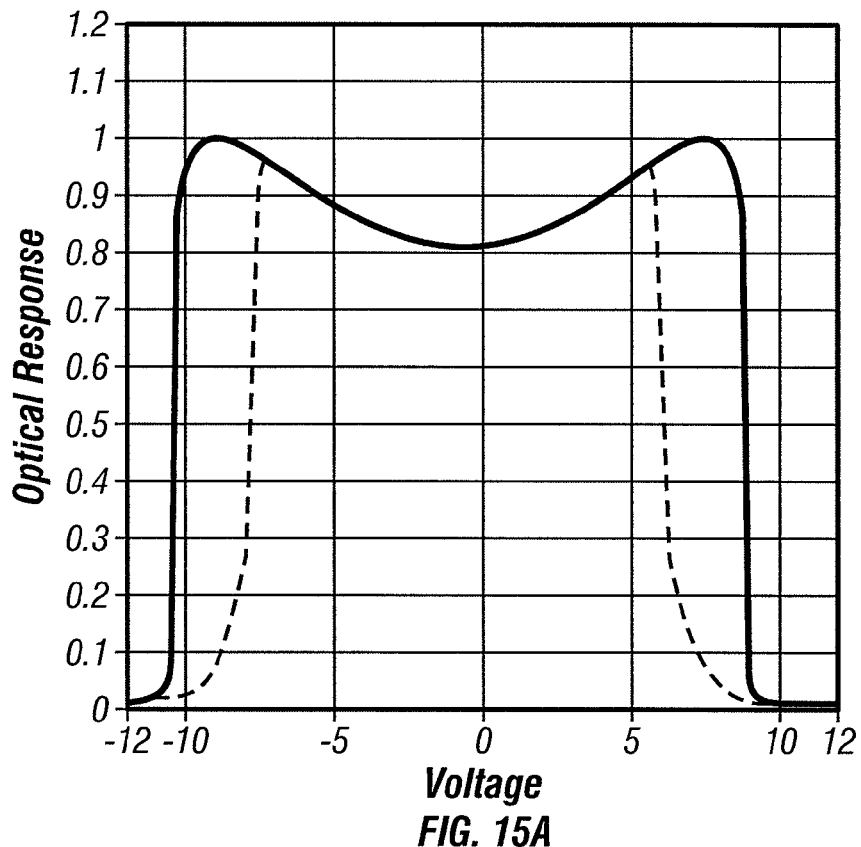
FIG. 15A is a graph illustrating the hysteresis properties of an interferometric modulator.
Figure 15B:
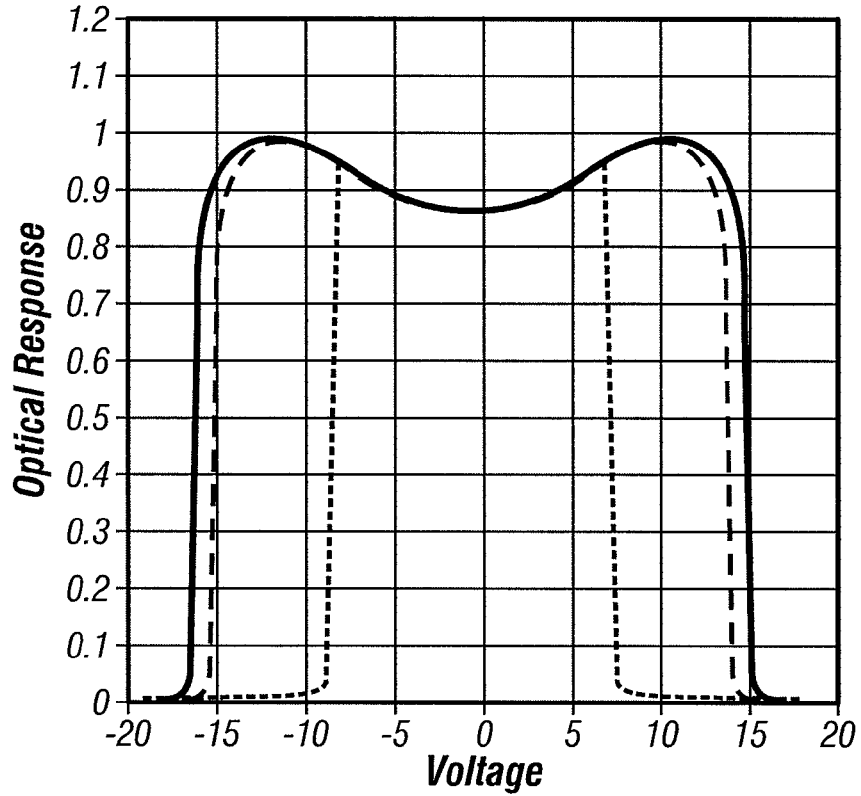
FIG. 15B is a graph illustrating the hysteresis properties of an interferometric modulator having a slot in the boundary region of the movable reflective layer, according to one embodiment.

FIGS. 15A and 15B show graphs illustrating the hysteresis properties of an interferometric modulator without slots (FIG. 15A) and of an interferometric modulator configured (e.g., with a slot) in accordance with an embodiment (FIG. 15B). As will be appreciated by one of skill in the art, the interferometric modulator configured according to an embodiment (FIG. 15B) exhibits a wider hysteresis window, and thus possesses a larger usable operating voltage window, than does the modulator without a slot (FIG. 15A). It is also apparent from the figures that the modulator without a slot (FIG. 15A) exhibits soft release issues. In contrast, release is sharp in the interferometric modulator configured according to an embodiment (FIG. 15B).

EXAMPLE 1

A MEMS display was configured with interferometric modulators having variously sized air gaps between the optical stack and the deformable layer, with the deformable layer arranged as parallel strips or columns. No slots were provided in the boundary regions between adjacent sub-pixels of each column. The column deformable layer was a layer of silicon oxynitride (SiON) sandwiched between two layers of aluminum (Al). The columns were approximately 36 μm wide as drawn on mask, and approximately 35 μm after fabrication. The total thickness of the column deformable layer was as follows: high gap=100 nm; medium gap=250 nm; low gap=350 nm. The modulators exhibited the following characteristics:

TABLE I

| MEMS display with no slot cuts between sub-pixels | | | |
| --- | --- | --- | --- |
| Size of Air Gap | Actuation Voltage | Hysteresis Window | Soft Release |
| High Gap | 8.1 V | 2.5 V | yes |
| Medium Gap | 10.0 V | 3.5 V | yes |
| Low Gap | 8.5 V | 2.5 V | yes |

COMPARATIVE EXAMPLE 1A

A MEMS display was configured with interferometric modulators having variously sized air gaps between the optical stack and the deformable layer, with the deformable layer arranged as parallel strips or columns. Slots were provided in the boundary regions between adjacent sub-pixels of each column. The column deformable layer was a layer of silicon oxynitride disposed between two layers of aluminum. The columns were approximately 36 μm wide as drawn on mask, and approximately 35 μm after fabrication, The slots formed were approximately 29 μm long by 2 μm wide as drawn on mask, and approximately 30 μm long by 3 μm wide after fabrication. The total thickness of the column deformable layer was as follows: high gap=100 nm; medium gap=250 nm; low gap=350 nm. The modulators exhibited the following characteristics:

TABLE II

MEMS display with slot cuts between sub-pixels

| Size of Air Gap | Actuation Voltage | Hysteresis Window | Soft Release |
|---|---|---|---|
| High Gap | 17.2 V | 5.4 V | mitigated |
| Medium Gap: rectangular post | 17.5 V | 6.5 V | no |
| Medium Gap: octagonal post | 15.0 V | 5.4 V | no |
| Low Gap | 10.5 V | 3.9 V | no |

This example illustrates that providing slots at boundary regions between adjacent sub-pixels in the columns of an interferometric modulator device can both increase the hysteresis window for the device, and improve release characteristics of the device.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. An electromechanical systems device comprising:
   a substrate; and
   a plurality of deformable electrodes over the substrate, each deformable electrode comprising a deformable layer and a reflective layer in substantially continuous contact with the deformable layer, each deformable layer extending in a first direction, each deformable electrode being supported along opposing edges by a plurality of supports, each deformable electrode having at least one opening extending through the deformable layer and the reflective layer, each opening being defined by a first dimension and a second dimension greater than the first dimension, the second dimension extending in a second direction generally perpendicular to the first direction.

2. The electromechanical systems device of claim 1 wherein the deformable electrodes are electrically isolated from one another.

3. The electromechanical systems device of claim 1, wherein the opening is disposed generally between independently actuatable sub-portions of the deformable electrode.

4. The electromechanical systems device of claim 1, wherein each opening extends generally between a pair of the supports.

5. The electromechanical systems device of claim 1, wherein each opening has a first end and a second end, the first end being disposed over a portion of a first support, the second end being disposed over a portion of a second support.

6. The electromechanical systems device of claim 1, wherein the second dimension is substantially equal to a distance between a pair of the supports.

7. The electromechanical systems device of claim 1, wherein the second dimension is slightly greater than a distance between a pair of the supports.

8. The electromechanical systems device of claim 1, wherein a pair of consecutive openings in a deformable electrode defines a sub-portion of the deformable electrode.

9. The electromechanical systems device of claim 8, wherein the second dimension is selected to substantially eliminate cross-talk between adjacent sub-portions of the deformable electrode.

10. The electromechanical systems device of claim 1, further comprising a second reflective layer disposed over the substrate.

11. The electromechanical systems device of claim 1, wherein the device comprises a MEMS device.

12. The electromechanical systems device of claim 1, wherein the device comprises an interferometric modulator.

13. An electromechanical systems device comprising:
    a substrate;
    means for reflecting light, the reflecting means being electrically conductive and deformable towards the substrate;
    means for supporting the reflecting means over the substrate; and
    means for reducing cross-talk between adjacent sub-portions of the reflecting means while maintaining electrical conductivity through the reflecting means, the means for reducing cross-talk including one or more openings extending through the reflecting means.

14. The electromechanical systems device of claim 13, wherein the reflecting means comprises a deformable layer.

15. The electromechanical systems device of claim 13, wherein the reflecting means comprises a dielectric layer.

16. The electromechanical systems device of claim 13, wherein the supporting means comprises a plurality of supports, each support being disposed near a corner region of a sub-portion of the reflecting means.

17. A display device comprising the electromechanical systems device of claim 1.

18. The display device of claim 17, further comprising:
    a processor that is configured to communicate with said display, said processor being configured to process image data; and
    a memory device that is configured to communicate with said processor.

19. The display device as recited in claim 18, further comprising a driver circuit configured to send at least one signal to said display.

20. The display device as recited in claim 19, further comprising a controller configured to send at least a portion of said image data to said driver circuit.

21. The display device as recited in claim 18, further comprising an image source module configured to send said image data to said processor.

22. The display device as recited in claim 21, wherein said image source module comprises at least one of a receiver, transceiver, and transmitter.

23. The display device as recited in claim 18, further comprising an input device configured to receive input data and to communicate said input data to said processor.

* * * * *

UNITED STATES PATENT AND TRADEMARK OFFICE
CERTIFICATE OF CORRECTION

| | |
|---|---|
| PATENT NO. | : 8,270,056 B2 |
| APPLICATION NO. | : 12/409425 |
| DATED | : September 18, 2012 |
| INVENTOR(S) | : Tao et al. |

Page 1 of 1

It is certified that error appears in the above-identified patent and that said Letters Patent is hereby corrected as shown below:

Title page, item 56 at line 3, Under U.S. Patent Documents, change "1/1952" to --4/1952--.

Title page 4, item 56 at line 71, Under Other Publications, change "MEM" to --MEMS--.

Title page 5, item 56 at line 11, Under Other Publications, change "Liquivista" to --Liquavista--.

Title page 5, item 56 at line 21, Under Other Publications, change "IEEEE" to --IEEE--.

In column 8 at line 17 (approx.), change "respectively" to --respectively.--.

In column 9 at line 41, change "ore" to --or--.

In column 19 at line 55, change "t the" to --the--.

In column 21 at line 3, change "fabrication," to --fabrication.--.

Signed and Sealed this
Twenty-sixth Day of February, 2013

Teresa Stanek Rea
*Acting Director of the United States Patent and Trademark Office*